United States Patent

Ogawa

(10) Patent No.: US 8,937,022 B2
(45) Date of Patent: Jan. 20, 2015

(54) METHOD OF MANUFACTURING SEMICONDUCTOR DEVICE, SUBSTRATE PROCESSING METHOD AND SUBSTRATE PROCESSING APPARATUS

(75) Inventor: Arito Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/990,282

(22) PCT Filed: Nov. 29, 2011

(86) PCT No.: PCT/JP2011/077485
§ 371 (c)(1),
(2), (4) Date: Jul. 1, 2013

(87) PCT Pub. No.: WO2012/073938
PCT Pub. Date: Jun. 7, 2012

(65) Prior Publication Data
US 2013/0309876 A1    Nov. 21, 2013

(30) Foreign Application Priority Data

Nov. 29, 2010    (JP) .................................. 2010-264904

(51) Int. Cl.
| | | |
|---|---|---|
| H01L 21/318 | (2006.01) | |
| C23C 16/08 | (2006.01) | |
| C23C 16/34 | (2006.01) | |
| C23C 16/455 | (2006.01) | |
| H01L 21/285 | (2006.01) | |
| H01L 21/28 | (2006.01) | |
| H01L 29/49 | (2006.01) | |

(52) U.S. Cl.
CPC .............. *H01L 21/318* (2013.01); *C23C 16/08* (2013.01); *C23C 16/34* (2013.01); *C23C 16/45523* (2013.01); *C23C 16/45527* (2013.01); *H01L 21/28556* (2013.01); *H01L 21/28562* (2013.01);

(Continued)

(58) Field of Classification Search
None
See application file for complete search history.

(56) References Cited

U.S. PATENT DOCUMENTS

| | | |
|---|---|---|
| 2006/0060137 A1 | 3/2006 | Hasper et al. |
| 2006/0193980 A1 | 8/2006 | Hasegawa |

(Continued)

FOREIGN PATENT DOCUMENTS

| | | |
|---|---|---|
| JP | A-6-314660 | 11/1994 |
| JP | A-2002-299283 | 10/2002 |

(Continued)

OTHER PUBLICATIONS

International Search Report issued in International Patent Application No. PCT/JP2011/077485 dated Jan. 31, 2012.

*Primary Examiner* — Telly Green
*Assistant Examiner* — Pamela E Perkins
(74) *Attorney, Agent, or Firm* — Oliff PLC

(57) ABSTRACT

A method of manufacturing a semiconductor device includes: housing a substrate into a processing chamber; and forming a metal nitride film on the substrate by supplying a source gas containing a metal element, a nitrogen-containing gas and a hydrogen-containing gas into the processing chamber; wherein in forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

10 Claims, 12 Drawing Sheets

(52) U.S. Cl.
CPC ....... *H01L 21/28088* (2013.01); *H01L 29/4966* (2013.01)
USPC ....... 438/769; 438/775; 438/785; 257/E21.17

(56) References Cited

U.S. PATENT DOCUMENTS

2010/0055433 A1* 3/2010 Shinriki et al. ............... 428/220
2010/0304567 A1 12/2010 Sakai et al.
2011/0076857 A1* 3/2011 Akae et al. .................... 438/769

FOREIGN PATENT DOCUMENTS

| JP | A-2004-263207 | 9/2004 |
| JP | A-2004-296490 | 10/2004 |
| JP | A-2006-93653 | 4/2006 |
| JP | A-2011-6782 | 1/2011 |
| WO | WO 2005/069358 A1 | 7/2005 |

* cited by examiner

FIG. 9
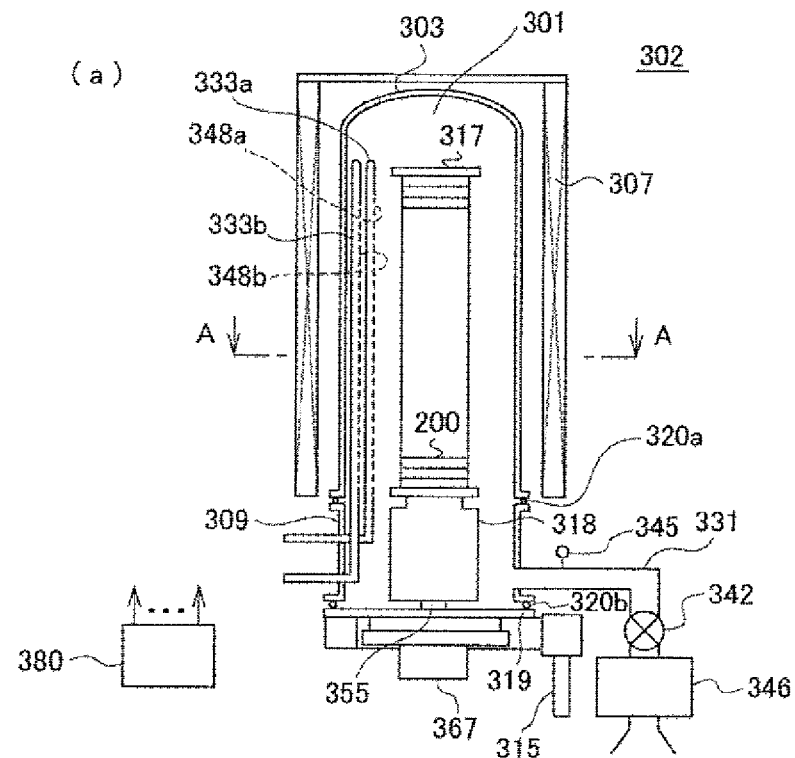
(a)
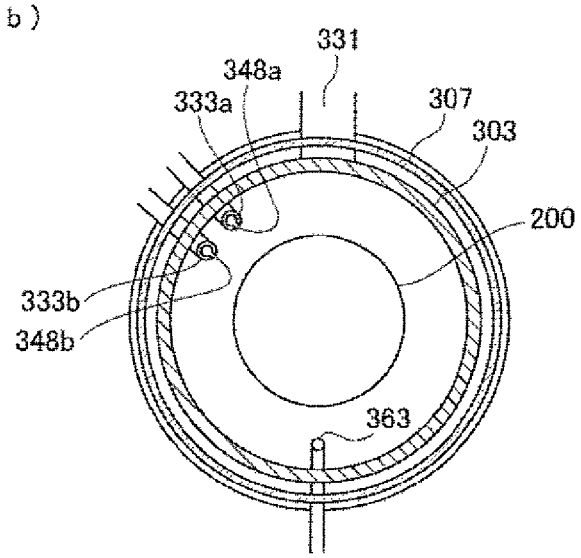
(b)

US 8,937,022 B2

METHOD OF MANUFACTURING SEMICONDUCTOR DEVICE, SUBSTRATE PROCESSING METHOD AND SUBSTRATE PROCESSING APPARATUS

TECHNICAL FIELD

The present invention relates to a method of manufacturing a semiconductor device, a substrate processing method and a substrate processing apparatus.

DESCRIPTION OF RELATED ART

With higher density integration and higher performance of MOSFET (Metal-Oxide-Semiconductor Field Effect Transistor), various kinds of metal films are used. For example, a conductive metal nitride film is used for a gate electrode and a capacitor electrode for DRAM.

SUMMARY

Technical Problem

The metal nitride film can be formed by a CVD (Chemical Vapor Deposition) method for simultaneously supplying a source gas and a nitrogen-containing gas into a processing vessel into which a substrate is loaded. As the source gas, a chlorine (Cl) or fluorine (F)-based gas is used in many cases, and for example, a titanium tetrachloride ($TiCl_4$) gas, etc., is used for forming a titanium nitride (TiN) film, and a tantalum pentachloride ($TaCl_5$) gas or a tantalum pentafluoride ($TaF_5$) gas, etc., is used for forming a tantalum nitride (TaN) film. Further, as the nitrogen-containing gas, for example an ammonia ($NH_3$) gas is used. However, when the metal nitride film is formed by the above-mentioned technique, impurities such as Cl and F, etc., are mixed into a film in some cases.

Therefore, an object of the present invention is to provide a method of manufacturing a semiconductor device, a substrate processing method and a substrate processing apparatus, capable of reducing an impurity concentration in the metal nitride film.

Solution to Problem

According to an aspect of the present invention, there is provided a method of manufacturing a semiconductor device, including:

housing a substrate into a processing chamber; and forming a metal nitride film on the substrate by supplying a source gas containing a metal element, a nitrogen-containing gas and a hydrogen-containing gas into the processing chamber;

wherein in forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

According to other aspect of the present invention, there is provided a substrate processing method, including:

housing a substrate into a processing chamber; and forming a metal nitride film on the substrate by supplying a source gas containing a metal element, a nitrogen-containing gas and a hydrogen-containing gas into the processing chamber;

wherein in forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

According to further other aspect of the present invention, there is provided a substrate processing apparatus, including:

a processing chamber configured to house a substrate;

a source gas supply system configured to supply a source gas containing a metal element into the processing chamber;

a nitrogen-containing gas supply system configured to supply a nitrogen-containing gas into the processing chamber;

a hydrogen-containing gas supply system configured to supply a hydrogen-containing gas into the processing chamber; and a control part configured to control the source gas supply system, the nitrogen-containing gas supply system, and the hydrogen-containing gas supply system, so that a processing is performed to form a metal nitride film on the substrate by supplying the source gas, the nitrogen-containing gas, and the hydrogen-containing gas into the processing chamber in which the substrate is housed, and in the processing of forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

Advantage of the Invention

According to a method of manufacturing a semiconductor device, a substrate processing method and a substrate processing apparatus of the present invention, an impurity concentration in a metal nitride film can be reduced.

BRIEF DESCRIPTION OF THE DRAWINGS

FIG. 9 is a schematic block diagram of a vertical processing furnace of a vertical CVD device suitably used in other embodiment of the present invention, and FIG. 9(a) shows a processing furnace 302 part in a vertical sectional face, and FIG. 9(b) shows the processing furnace 302 part taken along the line A-A of FIG. 9(a).

FIG. 10(a) is a timing chart showing a gas supply sequence in which purging by an $N_2$ gas is omitted, and instead, an $H_2$ gas is continuously supplied, and FIG. 10(b) is a timing chart showing a gas supply sequence in which purging by the $N_2$ gas is omitted, and instead, a $NH_3$ gas is continuously supplied, and FIG. 10(c) is a timing chart showing a gas supply sequence in which purging by the $N_2$ gas is omitted, and instead, the $H_2$ gas and the $NH_3$ gas are continuously supplied.

FIG. 11(a) is a timing chart showing a gas supply sequence in which supply of the $H_2$ gas is continued even after stop of supply of the $NH_3$ gas, and FIG. 11(b) is a timing chart showing a gas supply sequence in which purging by the $N_2$ gas is performed after stop of supply of the $H_2$ gas, and FIG. 11(c) is a timing chart showing a gas supply sequence in which the $H_2$ gas is continuously supplied.

DESCRIPTION OF EMBODIMENTS

Figure 2:
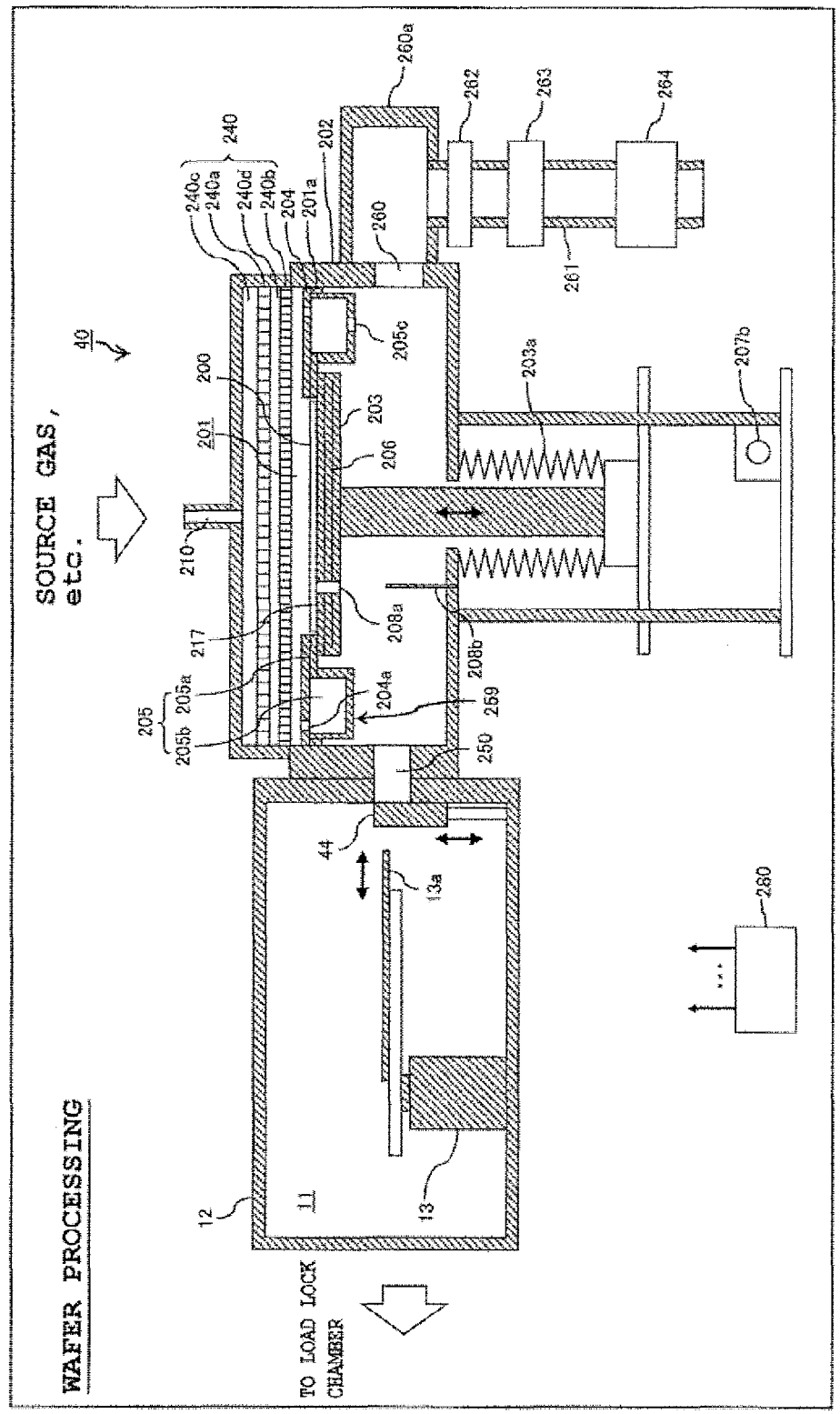
FIG. 2 is a cross-sectional block diagram during wafer processing applied to the substrate processing apparatus according to an embodiment of the present invention.
Figure 3:
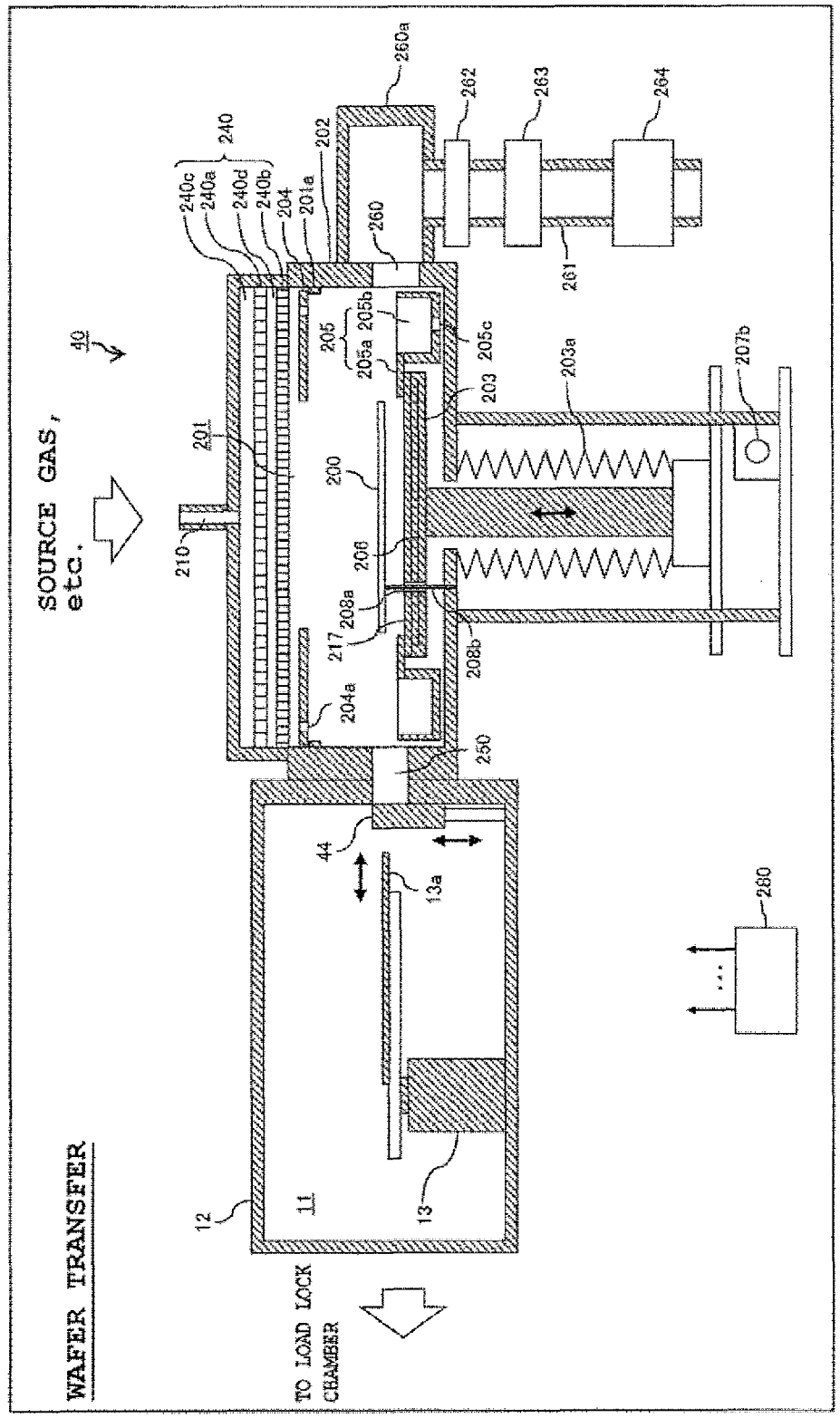
FIG. 3 is a cross-sectional block diagram during wafer transfer applied to the substrate processing apparatus according to an embodiment of the present invention.

First Embodiment of the Present Invention (1) Structure of the Substrate Processing Apparatus First, a structure of the substrate processing apparatus according to this embodiment will be descried, with reference to FIG. 2 and FIG. 3. FIG. 2 is a cross-sectional block diagram during wafer processing applied to a substrate processing apparatus 40 according to an embodiment of the present invention, and FIG. 3 is a cross-sectional block diagram during wafer transfer of the substrate processing apparatus 40 according to an embodiment of the present invention.

(Processing Chamber)

As shown in FIG. 2 and FIG. 3, the substrate processing apparatus 40 of this embodiment includes a processing vessel 202. The processing vessel 202 is formed into a circular shape in cross-section, and is formed as a flat sealing vessel. Further, the processing vessel 202 is made of a metal material such as aluminum (Al) and stainless (SUS), etc. A processing chamber 201 for processing a wafer 200 such as a silicon wafer, etc., as a substrate, is formed in the processing vessel 202.

(Supporting Table)

A supporting table 203 supporting the wafer 200 is provided in the processing chamber 201. A susceptor 217 as a supporting plate made of, for example, quartz ($SiO_2$), carbon, ceramics, silicon carbide (SiC), aluminum oxide ($Al_2O_3$), or aluminum nitride (AlN), etc., is provided on an upper surface of the supporting table 203 which is in direct contact with the wafer 200. Further, a heater 206 as a heating unit (heating source) for heating the wafer 200, is built in the supporting table 203. A lower end part of the supporting table 203 penetrates a bottom part of the processing vessel 202.

(Elevation Mechanism)

An elevation mechanism 207b for elevating the supporting table 203, is provided outside of the processing chamber 201. By elevating the supporting table 203 under operation of the elevation mechanism 207b, the wafer 200 supported on the susceptor 217 can be elevated. The supporting table 203 is descended to a position shown in FIG. 3 (wafer transfer position), and is elevated to a position shown in FIG. 2 (wafer processing position) during processing of the wafer 200. A circumference of the lower end part of the supporting table 203 is covered with a bellows 203a, so that an inside of the processing chamber 201 is air-tightly closed.

(Lift Pin)

Further, for example three lift pins 208b are provided on a bottom surface (floor surface) of the processing chamber 201 so as to rise in a vertical direction. Further, through holes 208a through which the lift pins 208b are passed, are provided on the supporting table 203 (including the susceptor 217), respectively at positions corresponding to the lift pins 208b. When the supporting table 203 is descended down to the wafer transfer position, as shown in FIG. 3, an upper end part of the lift pins 208b protrudes from the upper surface of the susceptor 217, so that the wafer 200 is supported from below by the lift pin 208b. Further, when the supporting table 203 is elevated up to the wafer processing position, as shown in FIG. 2, the lift pin 208b is buried from the upper surface of the susceptor 217, so that the wafer 200 is supported from below by the susceptor 217. Since the lift pin 208b is brought into direct contact with the wafer 200, it is preferably made of a material such as quartz or alumina.

(Wafer Transfer Port)

A wafer transfer port 250 for transferring the wafer 200 to/from the processing chamber 201, is provided on an inner wall side face of the processing chamber 201 (processing vessel 202). A gate valve 44 is provided on the wafer transfer port 250, and by opening the gate valve 44, an inside of the processing chamber 201 and an inside of a negative pressure transfer chamber 11 are communicated with each other. The negative pressure transfer chamber 11 is formed in a transfer vessel (sealed vessel) 12, and a negative pressure transferring machine 13 for transferring the wafer 200, is provided in the negative pressure transfer chamber 11. A transferring arm 13a for supporting the wafer 200 during transfer of the wafer 200, is provided on the negative pressure transferring machine 13. By opening the gate valve 44, with the supporting table 203 descended down to the wafer transfer position, the wafer 200 can be transferred by the negative pressure transferring machine 13 between the inside of the processing chamber 201 and the inside of the negative pressure transfer chamber 11. The wafer 200 transferred into the processing chamber 201, is temporarily placed on the lift pin 208b as described above. A load lock chamber not shown is provided on an opposite side to a side where the wafer transfer port 250 of the negative pressure transfer chamber 11 is provided, so that the wafer 200 can be transferred by the negative pressure transferring machine 13 between the inside of the load lock chamber and the inside of the negative transfer chamber 11. The load lock chamber functions as a pre-processing chamber in which an unprocessed or processed wafer 200 is temporarily housed.

(Exhaust System)

An exhaust port 260 for exhausting an atmosphere in the processing chamber 201, is provided on the opposite side to the wafer transfer port 250 on a side face of an inner wall of the processing chamber 201 (processing vessel 202). An exhaust tube 261 is connected to the exhaust port 260 through an exhaust chamber 260a, wherein a pressure adjuster 262 such as an APC (Auto Pressure Controller), etc., for controlling the pressure inside of the processing chamber 201 to a specific pressure, a source recovering trap 263, and a vacuum pump 264 are sequentially connected to the exhaust tube 261 in series. An exhaust system (exhaust line) is mainly constituted of the exhaust port 260, the exhaust chamber 260a, the exhaust tube 261, the pressure adjuster 262, the source recovering trap 263, and the vacuum pump 264.

(Gas Introducing Port)

A gas introducing port 210 for supplying each kind of gas into the processing chamber 201, is provided on an upper surface (ceiling wall) of a shower head 240 as described later, which is provided in an upper part of the processing chamber 201. A structure of a gas supply system connected to the gas introducing port 210, will be described later.

(Shower Head)

The shower head 240 as a gas dispersion mechanism, is provided between the gas introducing port 210 and the processing chamber 201. The shower head 240 includes a dispersion plate 240a for dispersing a gas introduced from the gas introducing port 210, and a shower plate 240b for uniformly dispersing the gas passed through the dispersion plate 240a and supplying the gas to the surface of the wafer 200 on the supporting table 203. A plurality of air holes are provided on the dispersion plate 240a and the shower plate 240b. The dispersion plate 240a is disposed on the upper surface of the shower head 240 so as to face the shower plate 240b, and the shower plate 240b is disposed to face the wafer 200 on the supporting table 203. Spaces are provided between the upper surface of the shower head 240 and the dispersion plate 240a, and between the dispersion plate 240a and the shower plate 240b respectively, and the spaces function as a first buffer space (dispersion chamber) 240c for dispersing the gas supplied from the gas introducing port 210, and a second buffer space 240d for dispersing the gas passed through the dispersion plate 240a respectively.

(Exhaust Duct)

A level difference part 201a is provided on the side face of the inner wall of the processing chamber 201 (processing vessel 202). Then, the level difference part 201a is configured to hold a conductance plate 204 in the vicinity of the wafer processing position. The conductance plate 204 is configured as one donut-shaped (ring-shaped) disc with a hole provided therein for housing the wafer 200 in an inner peripheral part. A plurality of discharging ports 204a arranged in a peripheral direction with a specific interval formed between them, are provided on an outer peripheral part of the conductance plate 204. The discharging ports 204a are discontinuously formed so that an inner peripheral part of the conductance plate 204 can be supported by the outer peripheral part of the conductance plate 204.

Meanwhile, a lower plate 205 is locked on the outer peripheral part of the supporting table 203. The lower plate 205 includes a ring-shaped recess part 205b and a flange part 205a integrally provided in an inner side upper part of the recess part 205b. The recess part 205b is provided so as to close a gap between the outer peripheral part of the supporting table 203 and the side face of the inner wall of the processing chamber 201. A plate exhaust port 205c for discharging (flowing) the gas to the exhaust port 260 side from the recess part 205b, is provided in a part in the vicinity of the exhaust port 260 on the floor part of the recess part 205b. The flange part 205a functions as a lock part to be locked on an upper outer peripheral edge of the supporting table 203. By lock of the flange part 205a on the upper outer peripheral edge of the supporting table 203, the lower plate 205 is elevated or descended together with the supporting table 203, with elevation/descent of the supporting table 203.

When the supporting table 203 is elevated up to the wafer processing position, the lower plate 205 is also elevated up to the wafer processing position. As a result, an upper surface portion of the recess part 205b is closed by the conductance plate 204 retained in the vicinity of the wafer processing position, thus forming an exhaust duct 259, with an inside of the recess part 205b as a gas flow path area. At this time, the inside of the processing chamber 201 is partitioned into a processing chamber upper part higher than the exhaust duct 259, and a processing chamber lower part lower than the exhaust duct 259, by the exhaust duct 250 (the conductance plate 204 and the lower plate 205) and the supporting table 203. The conductance plate 204 and the lower plate 205 are preferably made of a hot-holdable material such as quartz for high heat resistant and high load resistant use, in consideration of a case of etching (a case of performing a self-cleaning) a reaction byproduct deposited on an inner wall of the exhaust duct 259.

Here, a gas flow in the processing chamber 201 during wafer processing, will be described. First, the gas supplied to the upper part of the shower head 240 from the gas introducing port 210, passes through the first buffer space (dispersion chamber) 240c, and enters into the second buffer space 240d from a plurality of holes of the dispersion plate 240a, and further passes through a plurality of holes of the shower plate 240b and is supplied into the process chamber 201, and is uniformly supplied onto the wafer 200. Then, the gas supplied onto the wafer 200 flows radially toward a radial outer side of the wafer 200. Then, an excess gas after being brought into contact with the wafer 200, radially flows toward a radial outer side of the wafer 200 over the conductance plate 204, and is discharged into the gas flow path area (into the recess part 205b) in the exhaust duct 259 from a discharging port provided on the conductance plate 204. Thereafter, the gas flows through the exhaust duct 259, and is exhausted to the exhaust port 260 through the plate exhaust port 205c. By such a flow of the gas, intrusion of the gas to the lower part of the processing chamber 201, namely, to a backside of the supporting table 203 or a bottom side of the processing chamber 201, can be suppressed.

Figure 1:
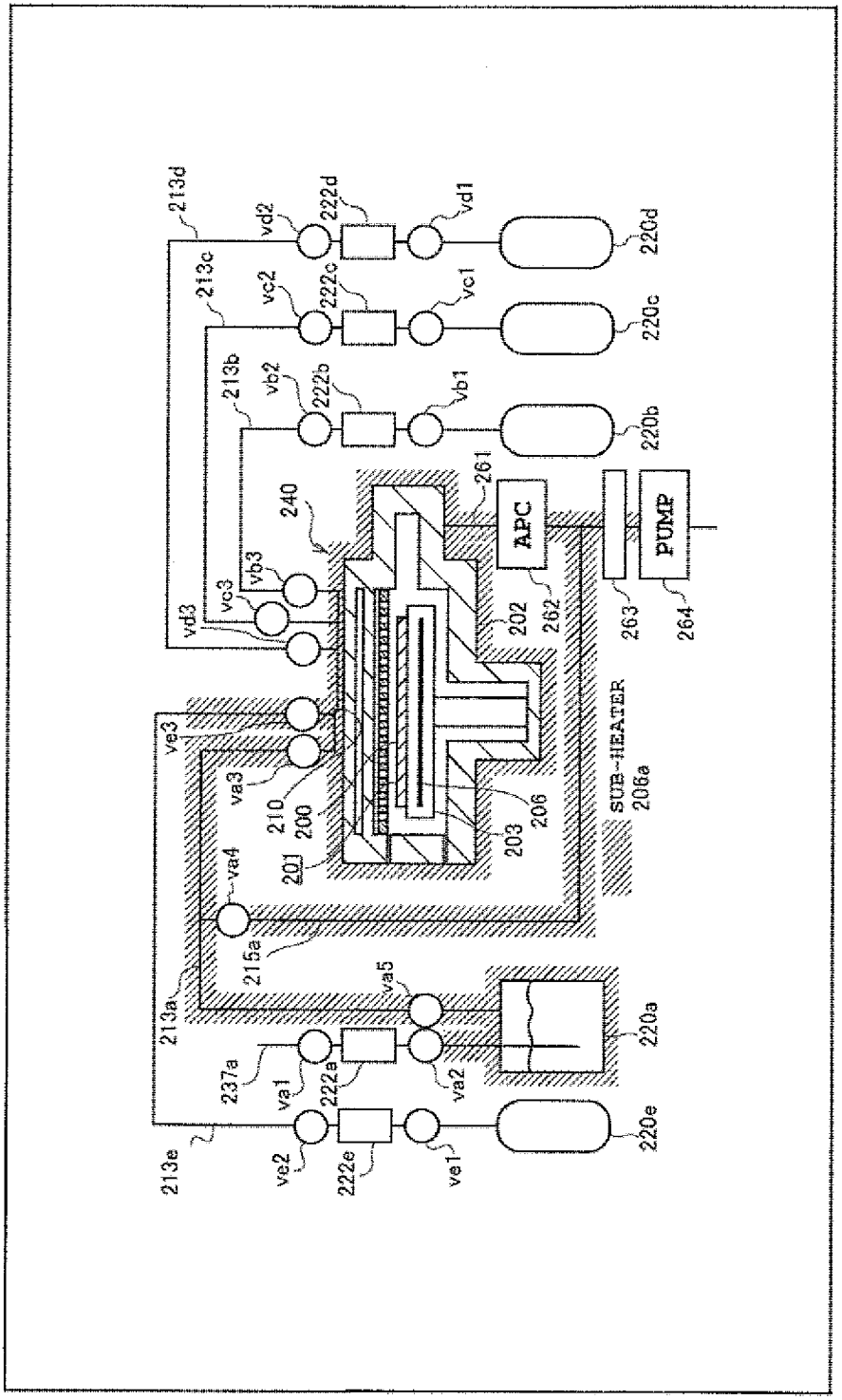
FIG. 1 is a block diagram of a gas supply system of a substrate processing apparatus according to an embodiment of the present invention.

Subsequently, a structure of the gas supply system connected to the above-mentioned gas introducing port 210, will be described with reference to FIG. 1. FIG. 1 is a block diagram of the gas supply system (gas supply line) provided in the substrate processing apparatus 40 of this embodiment.

The gas supply system provided in the substrate processing apparatus 40 of this embodiment includes a bubbler 220a as a vaporizer for vaporizing a liquid source in a liquid state under normal temperature and pressure; a source gas supply system for supplying a source gas obtained by vaporizing the liquid source by the bubbler 220a, into the processing chamber 201; a nitrogen-containing gas supply system for supplying a nitrogen-containing gas into the processing chamber 201; a hydrogen-containing gas supply system for supplying a hydrogen-containing gas into the processing chamber 201; and an inert gas supply system for supplying an inert gas into processing chamber 201. Further, the substrate processing apparatus according to an embodiment of the present invention includes a vent (bypass) system for exhausting the source gas from the bubbler 220a so as to bypass the processing chamber 201 without being supplied into the processing chamber 201. The structure of each part will be described hereafter.

(Bubbler)

The bubbler 220a as a source vessel for accommodating the liquid source, is provided outside of the processing chamber 201. The bubbler 220a is configured as a tank (sealed vessel) capable of accommodating (filling) the liquid source inside thereof, and is also configured as the vaporizer for vaporizing the liquid source by bubbling, and generating the source gas. A sub-heater 206a for heating the bubbler 220a and the liquid source inside thereof, is provided around the bubbler 220a. For example, hafnium tetrachloride ($HfCl_4$) being a metal liquid source containing a hafnium (Hf) element as a metal element, is used as a source.

A carrier gas supply tube 237a is connected to the bubbler 220a. A carrier gas supply source not shown is connected to an upper stream side end portion of the carrier gas supply tube 237a. Further, a downstream side end portion of the carrier gas supply tube 237a is dipped into the liquid source accommodated in the bubbler 220a. A mass flow controller (MFC) 222a as a flow rate control unit for controlling a supply flow rate of a carrier gas, and valves va1, va2 for controlling supply of the carrier gas, are provided on the carrier gas supply tube 237a. As the carrier gas, a gas not reacted with the liquid source is preferably used, and for example, an inert gas such as $N_2$ gas, Ar gas, or He gas, etc., is suitably used. A carrier gas supply system (carrier gas supply line) is mainly constituted of the carrier gas supply tube 237a, the MFC 222a, and the valves va1, va2.

With this structure, the valves va1, va2 are opened, to thereby supply the carrier gas into the bubbler 220a from the carrier gas supply tube 237a, with the flow rate controlled by the MFC 222a, and the liquid source accommodated in the bubbler 220a is vaporized by bubbling and the source gas ($HfCl_4$ gas) can be generated.

(Source Gas Supply System)

A source gas supply tube 213a for supplying the source gas generated in the bubbler 220a into the processing chamber 201, is connected to the bubbler 220a. The upper stream side end portion of the source gas supply tube 213a is communicated with a space in the upper part of the bubbler 220a. The downstream side end portion of the source gas supply tube 213a is connected to the gas introducing port 210. Valves va5, va3 are provided on the source gas supply tube 213a sequentially from an upstream side. The valve va5 is the valve for controlling supply of the source gas into the source gas supply tube 213a from the bubbler 220a, and is provided in the vicinity of the bubbler 220a. The valve va3 is the valve for controlling supply of the source gas into the processing chamber 201 from the source gas supply tube 213a, and is provided in the vicinity of the gas introducing port 210. The valve va3 and a valve ve3 described later are configured as high durable high speed gas valves. The high durable high speed gas valve is an integrated valve configured to switch supply of the gas and exhaust of the gas speedily in a short time. The valve ve3 is the valve for controlling an introduction of the inert gas used for purging the inside of the processing chamber 201 after speedily purging the space between the valve va3 of the source gas supply tube 213a and the gas introducing port 210.

With this structure, the source gas can be supplied into the processing chamber 201 from the source gas supply tube 213a, by vaporizing the liquid source by the bubbler 220a and generating the source gas, and opening the valves va5, va3. A source gas supply system (source gas supply line) is mainly constituted of the source gas supply tube 213a and the valves va5, va3.

Further, a source supply system (source supply line) is mainly constituted of the carrier gas supply system, the bubbler 220a, and the source gas supply system.

(Nitrogen-Containing Gas Supply System)

Further, a nitrogen-containing gas supply source 220b for supplying the nitrogen-containing gas being a reducing gas, is provided outside of the processing chamber 201. The upstream side end portion of the nitrogen-containing gas supply tube 213b is connected to the nitrogen-containing gas supply source 220b. The downstream side end portion of the nitrogen-containing gas supply tube 213b is connected to the gas introducing port 210 through the valve vb3. A mass flow controller (MFC) 222b as the flow rate control unit for controlling the supply flow rate of the nitrogen-containing gas, and valves vb1, vb2, vb3 for controlling supply of the nitrogen-containing gas, are provided on the nitrogen-containing gas supply tube 213b. As the nitrogen-containing gas, for example, ammonia ($NH_3$) gas, hydrazine ($N_2H_4$) gas, or $N_3H_8$ gas, etc., are used, and in this embodiment, for example the ammonia ($NH_3$) gas is used. A nitrogen-containing gas supply system (nitrogen-containing gas supply line) being a reducing gas supply system (reducing gas supply line) is mainly constituted of the nitrogen-containing gas supply source 220b, the nitrogen-containing gas supply tube 213b, the MFC 222b, and the valves vb1, vb2, vb3.

(Hydrogen-Containing Gas Supply System)

Further, a hydrogen-containing gas supply source 220c for supplying the hydrogen-containing gas being the reducing gas, is provided outside of the processing chamber 201. The upstream side end portion of the hydrogen-containing gas supply tube 213c is connected to the hydrogen-containing gas supply source 220c. The downstream side end portion of the hydrogen-containing gas supply tube 213c is connected to the gas introducing port 210 through the valve vc3. A mass flow controller (MFC) 222c as the flow rate control unit for controlling the supply flow rate of the hydrogen-containing gas, and valves vc1, vc2, vc3 for controlling supply of the hydrogen-containing gas, are provided on the hydrogen-containing gas supply tube 213c. As the hydrogen-containing gas, for example, a hydrogen ($H_2$) gas is used. A hydrogen-containing gas supply system (hydrogen-containing gas supply line) is mainly constituted of the hydrogen-containing gas supply source 220c, the hydrogen-containing gas supply tube 213c, the MFC 222c, and the valves vc1, vc2, vc3.

(Inert Gas Supply System)

Further, inert gas supply sources 220d, 220e for supplying the inert gas being the purge gas, are provided outside of the processing chamber 201. The upstream side end portions of the inert gas supply tubes 213d, 213e are respectively connected to the inert gas supply sources 220d, 220e. The downstream side end portion of the inert gas supply tube 213d is connected to the gas introducing port 210 through the valve vd3. The downstream side end portion of the inert gas supply tube 213e is joined with a portion between the valve va3 of the source gas supply tube 213a and the gas introducing port 210 through the valve ve3, and is connected to the gas introducing port 210. Mass flow controllers (MFC) 222d, 222e as the flow rate control units for controlling the supply flow rate of the inert gas, and the valves vd1, vd2, vd3, ve1, ve2, ve3 for controlling supply of the inert gas, are respectively provided on the inert gas supply tubes 213d, 213e respectively. As the inert gas, for example the inert gas such as $N_2$ gas, Ar gas, or He gas, etc., is used. An inert gas supply system (inert gas supply line) being a purge gas supply system (purge gas supply line) is manly constituted of the inert gas supply sources 220d, 220e, the inert gas supply tubes 213d, 213e, the MFCs 222d, 222e, and the valves vd1, vd2, vd3, ve1, ve2, ve3.

<Vent (Bypass) System>

Further, the upstream side end portion of a vent tube 215a is connected to the upstream side of the valve va3 of the source gas supply tube 213a. Further, the downstream side end portion of the vent tube 215a is connected to the upstream side of the source recovering trap 263, which is the downstream side of the pressure adjuster 262 of the exhaust tube 261. A valve va4 for controlling the flow of the gas, is provided on the vent tube 215a.

With this structure, the valve va3 is closed and the valve va4 is opened, to thereby make the gas flowing through the source gas supply tube 213a bypass the processing chamber 201 through the vent tube 215a without being supplied into the processing chamber 201, so as to be exhausted from the exhaust tube 261. A vent system (vent line) is mainly constituted of the vent tube 215a and the valve va4.

As described above, the sub-heater 206a is provided around the bubbler 220a. However, in addition, the sub-heater 206a is also provided around the carrier gas supply tube 237a, the source gas supply tube 213a, the inert gas supply tube 213e, the vent tube 215a, the exhaust tube 261, the processing vessel 202, and the shower head 240, etc. The sub-heater 206a is configured to prevent a re-liquefaction of the source gas inside of these members by heating these members at a temperature of 100° C. or less for example.

(Control Part)

Figure 12:
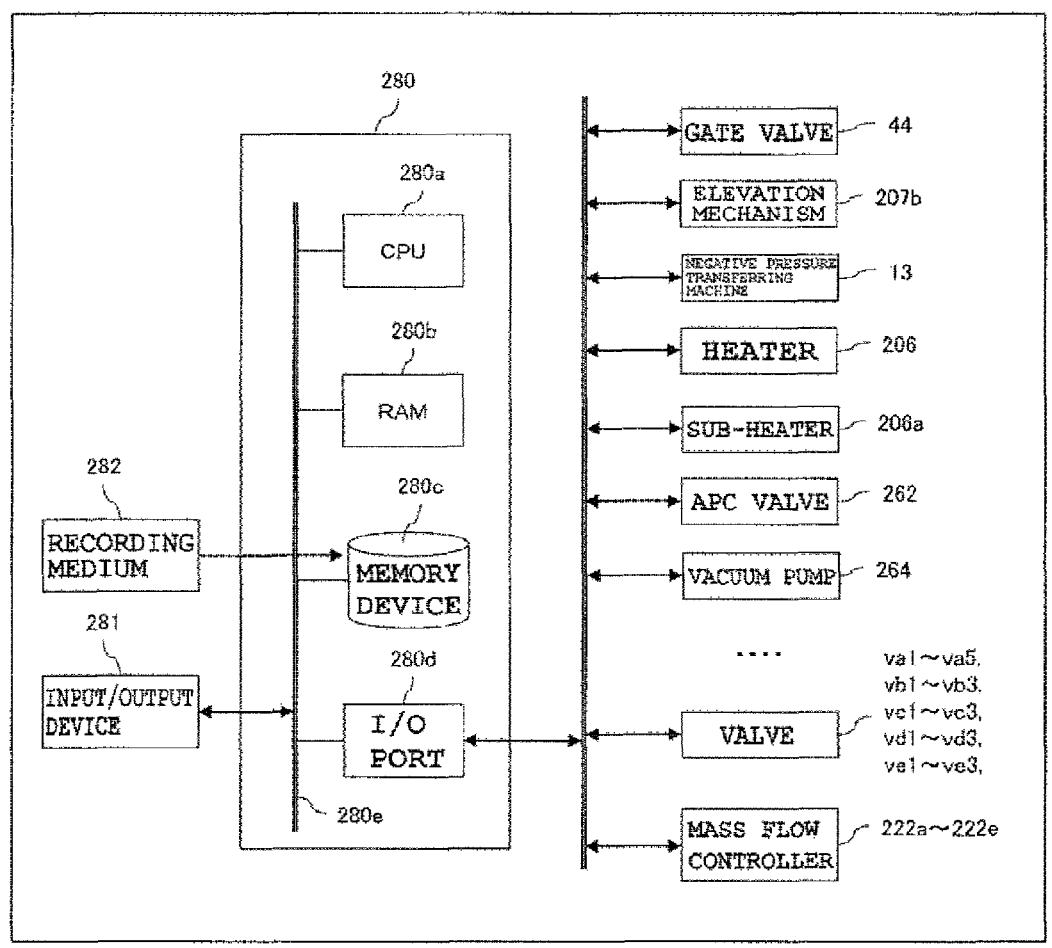
FIG. 12 is a schematic block diagram of a controller of the substrate processing apparatus suitably used in the embodiment of the present invention.

As shown in FIG. 12, a controller 280 being the control part (control unit) is configured as a computer equipped with a CPU (Central Processing Unit) 280a, a RAM (Random Access Memory) 280b, a memory device 280c and an I/O port 280d. The RAM 280b, the memory device 280c, and the I/O port 280d are configured to exchange data with the CPU 280a through an internal bus 280e. An input/output device 281 configured as a touch panel, etc., for example, is connected to the controller 280.

The memory device 280c includes a flash memory and HDD (Hard Disk Drive), etc., for example. A control program for controlling an operation of the substrate processing apparatus, and a process recipe, etc., indicating a procedure and a condition, etc., of substrate processing as will be descried later, are readably stored in the memory device 280c. The process recipe is a combination of recipes, so that each procedure in a substrate processing step described later is executed by the controller 280 to obtain a specific result, and functions as a program. The process recipe and the control program, etc., are generally simply called a program hereafter. The RAM 280b is configured as a memory area (work area) in which the program and data, etc., read by the CPU 280a are temporarily stored.

The I/O port 280d is connected to the above-mentioned gate valve 44, elevation mechanism 207b, negative pressure transferring machine 13, heater 206, sub-heater 206a, pressure adjuster (APC) 262, vacuum pump 264, valves va1 to va5, vb1 to vb3, vc1 to vc3, vd1 to vd3, ve1 to ve3, and mass flow controllers 222a, 222b, 222c, 222d, 222e, etc.

The CPU 280a is configured to read and execute the control program from the memory device 280c, and is configured to read the process recipe from the memory device 280c according to an input, etc., of an operation command from the input/output device 281. Then, the CPU 280a is configured to control an open/close operation of the gate valve 44, an elevating operation of the elevation mechanism 207b, a transferring operation of the negative pressure transferring machine 13, a temperature adjustment operation of the heater 206 and the sub-heater 206a, an open/close operation and a pressure adjustment operation of the pressure adjuster (APC) 262, start/stop of the vacuum pump 264, an open/close operation of the valves va1 to va5, vb1 to vb3, vc1 to vc3, vd1 to vd3, ve1 to ve3, and a flow rate adjustment operation of each kind of gas by the mass flow controllers 222a, 222b, 222c, 222d, 222e, based on a content of the read process recipe.

The controller 280 may be configured not only as a dedicated computer, but also as a general-purpose computer. For example, a computer-readable recording medium storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.) 282, is prepared, and by using the recording medium 282, the program is installed in the general-purpose computer, to thereby constitute the controller 280 according to this embodiment. Means for supplying the program to the computer, is not limited to a case of supplying it through the recording medium 282. For example, communication means such as Internet and a dedicated line, etc., may be used, to thereby supply the program not through the recording medium 282.

(2) Substrate Processing Step

Figure 4:
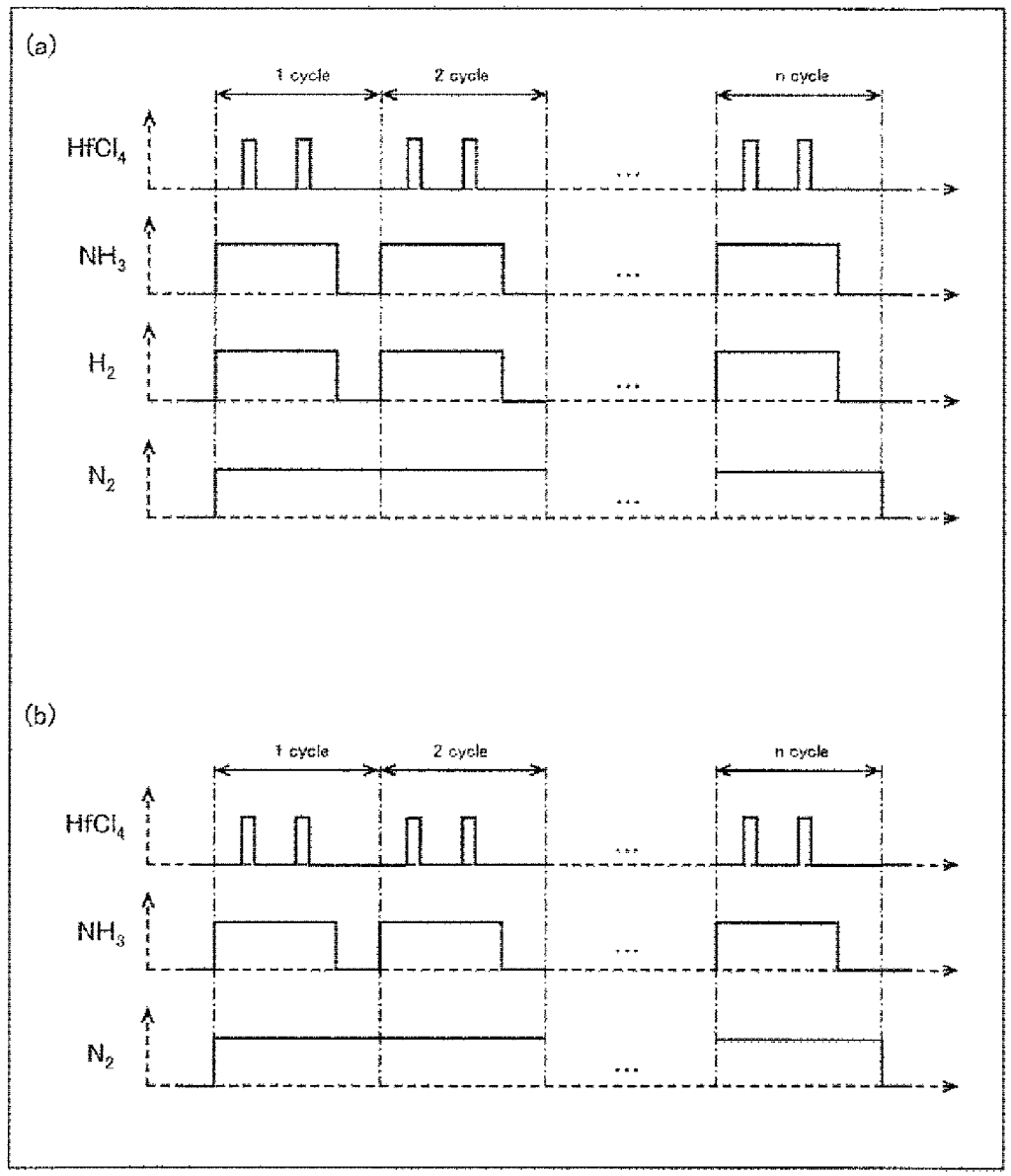
FIG. 4(*a*) is a timing chart showing a gas supply sequence according to a first embodiment of the present invention, and FIG. 4(*b*) is a timing chart showing a gas supply sequence in which supply of an $H_2$ gas is not performed.

Next, using FIG. 1 to FIG. 4(a), explanation is given for a substrate processing step of forming a hafnium nitride (HfN) film as a metal nitride film on the wafer 200, as one step of a manufacturing step of a semiconductor device, using the above-mentioned substrate processing apparatus. FIG. 4(a) is a timing chart showing a gas supply sequence according to this embodiment.

In this specification, the term of the metal film means a film made of a conductive substance including a metal atom, and such a film includes not only a conductive metal simple substance film made of a metal simple substance, but also a conductive metal nitride film, a conductive metal oxide film, a conductive metal oxynitride film, a conductive metal composite film, a conductive metal alloy film, a conductive metal silicide film, and a conductive metal carbide film, etc. The hafnium nitride (HfN) film is the conductive metal nitride film.

[Substrate Loading Step, Substrate Mounting Step]

The elevation mechanism 207b is operated, and the supporting table 203 is descended down to the wafer transfer position shown in FIG. 3. Then, the gate valve 44 is opened, to thereby communicate the processing chamber 201 and the negative pressure transfer chamber 11. Then, as described above, the wafer 200 is loaded into the processing chamber 201 from the negative pressure transfer chamber 11 by the negative pressure transfer mechanism 13, in a state of being supported by the transferring arm 13a. The wafer 200 loaded into the processing chamber 201 is temporarily mounted on the lift pin 208b protruded from the upper surface of the supporting table 203. When the transferring arm 13a of the negative pressure transferring machine 13 is returned into the negative pressure transfer chamber 11 from the processing chamber 201, the gate valve 44 is closed.

Subsequently, the elevation mechanism 207b is operated, and the supporting table 203 is elevated up to the wafer processing position shown in FIG. 2. As a result, the lift pin 208b is buried from the upper surface of the supporting table 203, and the wafer 200 is mounted on the susceptor 217 on the upper surface of the supporting table 203.

[Pressure Adjustment Step, Temperature Adjustment Step]

Subsequently, the pressure in the processing chamber 201 is controlled to a specific processing pressure by the pressure adjuster (APC) 262. Further, power supplied to the heater 206 is adjusted, so that a surface temperature of the wafer 200 is controlled to a specific processing temperature. The temperature adjustment step may be performed in parallel to the pressure adjustment step, or may be performed prior to the pressure adjustment step. Here, the specific processing temperature and processing pressure mean the processing temperature and the processing pressure allowing the HfN film to be formed by the CVD method in a film formation step described later, namely mean the processing temperature and the processing pressure allowing a self-decomposition to occur in the source used in the film formation step.

In a substrate loading step to a temperature adjustment step and a substrate unloading step described later, the valves va3, vb3, vc3 are closed while operating the vacuum pump 264, and the valves vd1, vd2, vd3, ve1, ve2, ve3 are opened, to thereby always flow the $N_2$ gas into the processing chamber 201. Thus, attachment of particles onto the wafer 200 can be suppressed.

Further, in parallel to the substrate loading step to the temperature adjustment step, the source gas (Hf source gas) obtained by vaporizing $HfCl_4$ being the liquid source (Hf source), which is an $HfCl_4$ gas, is generated (preliminarily vaporized). Namely, the valves va1, va2, va5 are opened, and the carrier gas with the flow rate controlled by the MFC 222a is supplied into the bubbler 220a from the carrier gas supply tube 237a, to thereby vaporize the source accommodated in the bubbler 220a by bubbling, and generate the source gas (preliminary vaporizing step). In this preliminary vaporizing step, the valve va4 is opened while operating the vacuum pump 264 and closing the valve va3, to thereby make the source gas bypass the processing chamber 201 and exhausted without being supplied into the processing chamber 201. A specific time is required for stably generating the source gas by the bubbler. Therefore, in this embodiment, the source gas is previously generated and open/close of the valves va3, va4 is switched, to thereby switch the flow path of the source gas. As a result, by switching the valves, supply of the source gas can be speedily started or stopped into/from the processing chamber 201, and this is preferable.

[Film Forming Step]

Subsequently, the $HfCl_4$ gas as the source gas containing the hafnium element and the $NH_3$ gas as the nitrogen-containing gas, are intermittently supplied and exhausted into/from the processing chamber 201, and the $H_2$ gas as the hydrogen-containing gas is supplied and exhausted into/from the processing chamber 201 during supply of the $NH_3$ gas, to thereby perform processing of forming the HfN film on the wafer 200 as the metal nitride film. In this embodiment, the $HfCl_4$ gas is intermittently supplied during supply of the $NH_3$ gas, and at this time, the $H_2$ gas is supplied and exhausted simultaneously with the $NH_3$ gas. More specific explanation is given hereafter, with reference to FIG. 4(a).

First, the valves vb1, vb2, vb3, vc1, vc2, vc3 are simultaneously opened, to thereby simultaneously start supply of the $NH_3$ gas and the $H_2$ gas into the processing chamber 201. The $NH_3$ gas and the $H_2$ gas with the flow rates controlled by the MFCs 222b and 222c, are dispersed by the shower head 240 and supplied into the processing chamber 201, and flow through the exhaust duct 259, and are exhausted to the exhaust port 260. Preferably, the valves vd3 and ve3 are left opened, to thereby always flow the $N_2$ gas in the processing chamber 201 during supply of the $NH_3$ gas and the $H_2$ gas into the processing chamber 201, so as to prevent an invasion of the $NH_3$ gas and the $H_2$ gas into the source gas supply tube 213a and promote a dispersion of the $NH_3$ gas and the $H_2$ gas in the processing chamber 201.

When a specific time is elapsed after start of supply of the $NH_3$ gas and the $H_2$ gas, and when the inside of the processing chamber 201 is in a mixed gas atmosphere of the $NH_3$ gas, the $H_2$ gas and the $N_2$ gas, the valve va4 is closed and the valve va3 is opened, to thereby start supply of the $HfCl_4$ gas into the processing chamber 201. The $HfCl_4$ gas is dispersed by the shower head 240 and is supplied into the processing chamber 201, and flows through the exhaust duct 259, and is exhausted to the exhaust port 260. The valves vb3, vc3, vd3, and ve3 are left opened during supply of the $HfCl_4$ gas into the processing chamber 201, to thereby always flow the $NH_3$ gas, the Hz gas, and the $N_2$ gas in the processing chamber 201. When the specific time is elapsed after start of supply of the $NH_3$ gas, the $H_2$ gas, and the $N_2$ gas, the valve va3 is closed and the valve va4 is opened, to thereby stop supply of the $HfCl_4$ gas into the processing chamber 201. The intermittent supply of the $HfCl_4$ gas is executed a specific number of times (for example, twice in FIG. 4(a)).

The $HfCl_4$ gas intermittently supplied into the processing chamber 201, is reacted with the $NH_3$ gas in the processing chamber 201, to thereby generate HfN and HCl gases. Then, the generated HfN is deposited on the wafer 200, to thereby form an HfN layer on the wafer 200 as a metal nitride layer having a specific thickness. As described above, Cl contained in the $HfCl_4$ gas is sometimes remained in the HfN layer. However, the Cl remained in the HfN layer is reacted with the $H_2$ gas supplied into the processing chamber 201, and is turned into the HCl gas, and is removed from the HfN layer, to thereby modify the HfN layer. The generated HCl gas flows through the exhaust duct 259 and is exhausted to the exhaust port 260.

In this embodiment, when the $HfCl_4$ gas and the $NH_3$ gas are simultaneously supplied, namely, in a process of forming the HfN layer, the $H_2$ gas is supplied. Therefore, when an extremely thin HfN layer is formed, Cl in such an extremely thin HfN layer can be immediately removed by an action of the $H_2$ gas. Namely, the Cl in the HfN layer can be removed when a thickness of the HfN layer is extremely thin. Such a reaction, namely, formation of the extremely thin HfN layer and removal of the Cl from the extremely thin HfN layer, are continuously performed during supply of the $HfCl_4$ gas.

Further, the $H_2$ gas is supplied after stop of supply of the $HfCl_4$ gas, namely, even after formation of the HfN layer, and therefore as described above, the Cl remained in the HfN layer which is formed while removing the Cl during supply of the $HfCl_4$ gas, can be further removed by the action of the $H_2$ gas.

The thickness of the HfN layer formed per one intermittent supply of the $HfCl_4$ gas, is preferably set to 2 nm or less. This is because when the thickness of the HfN layer formed at once exceeds 2 nm, an effect of removing the residual chlorine (Cl) by the $H_2$ gas, does not reach the whole body of the HfN layer. A minimum thickness of the HfN layer that can be formed at once, is less than one atomic layer. Therefore, the thickness of the HfN layer formed per one intermittent supply of the $HfCl_4$ gas is preferably set in a range of less than one atomic layer to 2 nm or less. A layer of less than one atomic layer means an atomic layer formed discontinuously.

When the specific time is elapsed after intermittent supply of the $HfCl_4$ gas, the valves vb3, vc3 are simultaneously closed, to thereby simultaneously stop supply of the $NH_3$ gas and the $H_2$ gas into the processing chamber 201. At this time, the valves vd3, ve3 are left opened, and supply of the $N_2$ gas into the processing chamber 201 is continuously performed.

Thus, the inside of the processing chamber 201 is purged by the $N_2$ gas, and gases or reaction byproducts remained in the processing chamber 201 is removed. At this time, the inside of the processing chamber 201 may be vacuumed instead of purging the inside of the processing chamber 201 by the $N_2$ gas, or before or after purging the inside of the processing chamber by the $N_2$ gas. By vacuuming the inside of the processing chamber 201, the Cl remained in the HfN layer from which Cl is removed by the action of the $H_2$ gas, can be further removed.

Then, the above-mentioned gas supply sequence (from start of supply of the $NH_3$ gas and the $H_2$ gas into the processing chamber 201, to the completion of purge of the inside of the processing chamber 201) is set as one cycle, and by performing this cycle a specific number of times, or preferably multiple numbers of times, the HfN film having a specific film thickness is formed on the wafer 200. The film thickness of the HfN film can be controlled by adjusting the number of times of executing the cycle.

Processing conditions of the wafer 200 in the film forming step of this embodiment are as follows for example:
Wafer temperature: 300 to 500° C.
Pressure in the processing chamber: 0.1 to 1000 Pa
$NH_3$ supply flow rate: 50 to 10000 sccm
$H_2$ supply flow rate: 50 to 10000 sccm
$HfCl_4$ supply flow rate: 10 to 500 sccm
$N_2$ supply flow rate: 50 to 10000 sccm

[Substrate Unloading Step]

Thereafter, the wafer 200 after forming the HfN film is unloaded into the negative pressure transfer chamber 11 from the processing chamber 201 by a reversed procedure to the procedure shown in the above-mentioned substrate loading step, and the substrate mounting step.

(3) Effect of this Embodiment

According to this embodiment, one or a plurality of effects are exhibited out of the effects shown below.

According to this embodiment, the $HfCl_4$ gas is intermittently supplied during supply of the $NH_3$ gas into the processing chamber 201, and at this time, the $H_2$ gas is supplied simultaneously with the $NH_3$ gas, to thereby form the HfN layer on the wafer 200. As described above, Cl contained in the $HfCl_4$ gas is sometimes remained in the HfN layer formed on the wafer 200. However, the Cl in the HfN layer is reacted with the $H_2$ gas supplied into the processing chamber 201 and is turned into the HCl gas and is removed from the HfN layer, to thereby modify the HfN layer. As a result, the HfN film of this embodiment contains reduced Cl concentration in the film and is improved in the film quality, compared with the HfN film formed by a technique of not performing supply of the $H_2$ gas shown in FIG. 4(b).

Further, according to this embodiment, the $HfCl_4$ gas is intermittently supplied during supply of the $NH_3$ gas into the processing chamber 201, wherein the thickness of the HfN layer formed per one intermittent supply of the $HfCl_4$ gas is set in the range of less than one atomic layer to 2 nm or less. Thus, the effect of removing the residual chlorine (Cl) by the $H_2$ gas, can reach the whole body of the HfN layer, thus reliably reducing the Cl concentration in the HfN film.

Further, according to this embodiment, the $H_2$ gas being the hydrogen-containing gas, is used as a modifying gas. Thus, Cl in the HfN layer can be removed thermally without using plasma, namely under a non-plasma atmosphere.

Second Embodiment of the Present Invention

In the film forming step of the first embodiment, the $HfCl_4$ gas is intermittently supplied during supply of the $NH_3$ gas.

Figure 5:
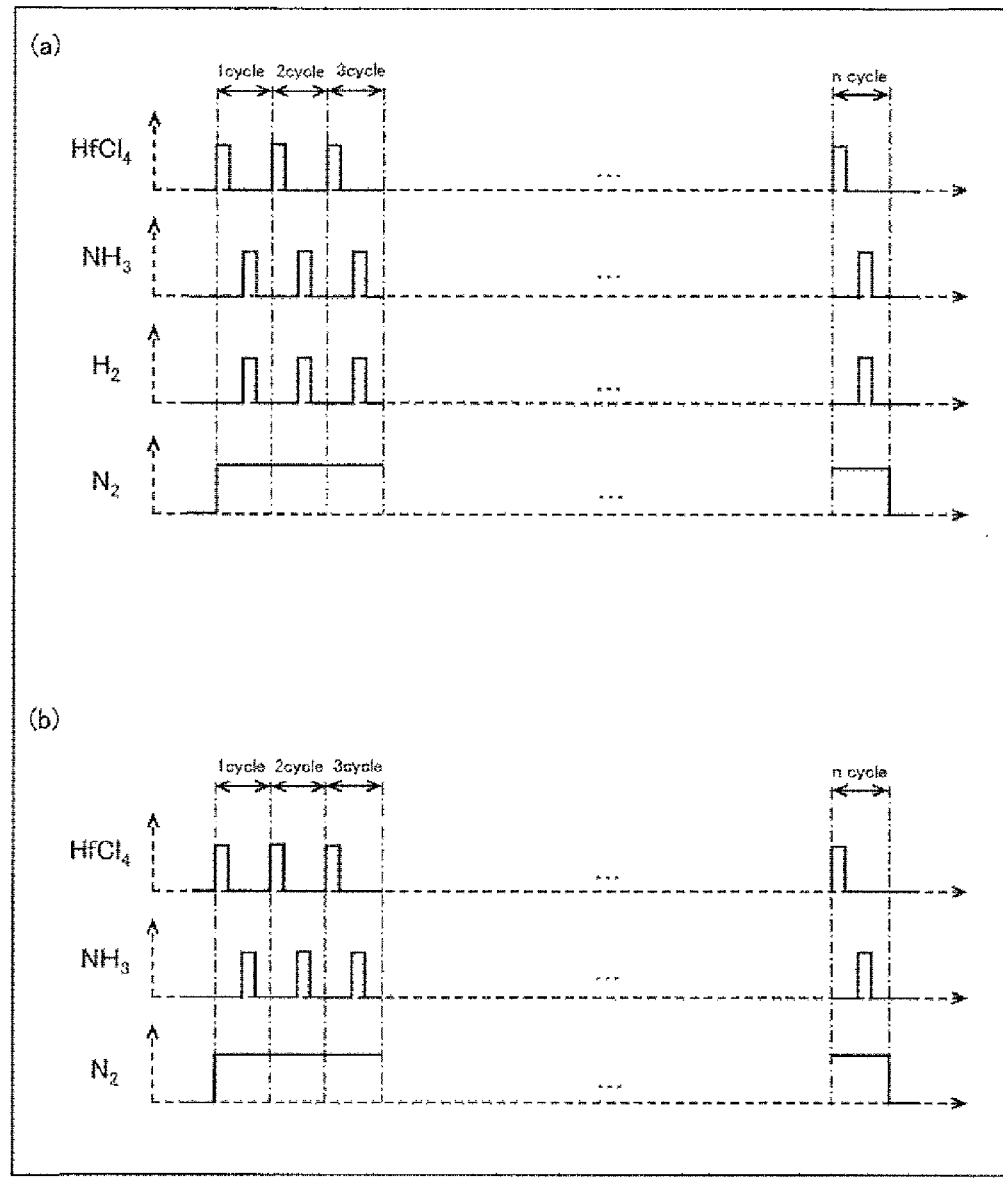
FIG. 5(a) is a timing chart showing a gas supply sequence according to a second embodiment of the present invention.
FIG. 5(b) is a timing chart showing a gas supply sequence in which supply of the $H_2$ gas is not performed.

However, in the film forming step of this embodiment, the $HfCl_4$ gas and the $NH_3$ gas are intermittently and alternately supplied. This point is different from the first embodiment. Further, in the film forming step, the processing temperature and the processing pressure in the processing chamber 201 are set to the processing temperature and the processing pressure allowing the HfN film to be formed by an ALD (Atomic Layer Deposition) method, namely, the processing temperature and the processing pressure not allowing the self-decomposition to occur in the source used in the film forming step. This point is also different from the first embodiment. Simultaneous supply of the $NH_3$ gas and the $H_2$ gas is the same point as the first embodiment. The film forming step of this embodiment will be described hereafter, with reference to FIG. 5(a).

First, the valve va4 is closed and the valve va3 is opened, to thereby start supply of the $HfCl_4$ gas into the processing chamber 201, namely irradiation of the $HfCl_4$ gas to the wafer 200 is started. The $HfCl_4$ gas is dispersed by the shower head 240 and is uniformly supplied onto the wafer 200 in the processing chamber 201. Gas molecules of the $HfCl_4$ are adsorbed on the wafer 200, to thereby form an Hf-containing layer. Excess $HfCl_4$ gas flows through the exhaust duct 259, and is exhausted to the exhaust port 260. During supply of the $HfCl_4$ gas into the processing chamber 201, the valves vd3, ve3 are left opened to prevent the invasion of the $HfCl_4$ gas into the nitrogen-containing gas supply tube 213b and the hydrogen-containing gas supply tube 213c, and promote the dispersion of the $HfCl_4$ gas in the processing chamber 201, to thereby always flow the $N_2$ gas in the processing chamber 201 preferably. When the specific time is elapsed after the valve va3 is opened to thereby start the supply of the $HfCl_4$ gas, the valve va3 is closed, and the valve va4 is opened, to thereby stop supply of the $HfCl_4$ gas into the processing chamber 201.

After stop of supplying the $HfCl_4$ gas into the processing chamber 201 by closing the valve va3, the valves vd3, ve3 are left opened, to thereby continuously perform supply of the $N_2$ gas into the processing chamber 201. The $N_2$ gas is supplied into the processing chamber 201 through the shower head 240, and flows through the exhaust duct 259, and is exhausted to the exhaust port 260. Thus, the inside of the processing chamber 201 is purged by the $N_2$ gas, and the $HfCl_4$ gas remained in the processing chamber 201 is removed.

When purging the inside of the processing chamber 201 is completed, the valves vb1, vb2, vb3, vc1, vc2, vc3 are simultaneously opened, to thereby simultaneously start supply of the $NH_3$ gas and the $H_2$ gas into the processing chamber 201, namely, irradiation of the $NH_3$ gas and the $H_2$ gas to the wafer 200. The $NH_3$ gas and the $H_2$ gas with the flow rates controlled by the MFCs 222b and 222c are dispersed by the shower head 240 respectively and are uniformly supplied onto the wafer 200 in the processing chamber 201, and flow through the exhaust duct 259, and are exhausted to the exhaust port 260. During supply of the $NH_3$ gas and the $H_2$ gas into the processing chamber 201, preferably the valves vd3, ve3 are left opened to prevent the invasion of the $NH_3$ gas and the $H_2$ gas into the source gas supply tube 213a, and promote the dispersion of the $NH_3$ gas and the $H_2$ gas in the processing chamber 201, to thereby always flow the $N_2$ gas in the processing chamber 201. When the specific time is elapsed after the valves vb1, vb2, vb3, vc1, vc2, vc3 are opened and supply of the $NH_3$ gas and the $H_2$ gas is started, the valves vb3, vc3 are simultaneously closed, to thereby simultaneously stop supply of the $NH_3$ gas and the $H_2$ gas into the processing chamber 201.

The $NH_3$ gas supplied into the processing chamber 201 is reacted with the Hf-containing layer formed on the wafer 200, to thereby form the HfN layer of less than one atomic layer to not more than several atomic layers (2 nm or less) on the wafer 200 and generate the HCl gas. As described above, Cl contained in the HfCl$_4$ gas is sometimes remained in the HfN layer. However, the Cl in the HfN layer is reacted with the H$_2$ gas supplied into the processing chamber 201, and is turned into the HCl gas, and is removed from the HfN layer, to thereby modify the HfN layer. The generated HCl gas flows through the exhaust duct 259, and is exhausted to the exhaust port 260.

In this embodiment, when the NH$_3$ gas is supplied, namely, in a process of forming the HfN layer, the H$_2$ gas is supplied. Therefore, when the extremely thin HfN layer is formed, the Cl in the extremely thin HfN layer can be immediately removed by the action of the H$_2$ gas. Namely, the Cl in the HfN layer can be removed when the thickness of the HfN layer is extremely thin. Then, such a reaction, namely, the formation of the extremely thin HfN layer and the removal of Cl from the extremely thin HfN layer are continuously performed during supply of the NH$_3$ gas.

When the valves vb3, vc3 are closed, and supply of the NH$_3$ gas and the H$_2$ gas into the processing chamber 201 is stopped, the valves vd3, ve3 are left opened, and supply of the N$_2$ gas into the processing chamber 201 is continuously performed. The N$_2$ gas is supplied into the processing chamber 201 through the shower head 240, and flows through the exhaust duct 259, and is exhausted to the exhaust port 260. Thus, the inside of the processing chamber 201 is purged again by the N$_2$ gas, to thereby remove gases or reaction byproducts remained in the processing chamber 201. At this time, instead of purging the inside of the processing chamber 201 by the N$_2$ gas, or before or after purging the inside of the processing chamber 201 by the N$_2$ gas, the inside of the processing chamber 201 may be vacuumed. By vacuuming the inside of the processing chamber 201, the Cl remained in the HfN layer from which the Cl is removed by the action of the H$_2$ gas, can be further removed.

Then, the above-mentioned gas supply sequence (from start of supply of the HfCl$_4$ gas into the processing chamber 201, to the completion of the second purge inside of the processing chamber 201) is set as one cycle, and by performing this cycle the specific number of times, preferably multiple numbers of times, the HfN film having the specific film thickness is formed on the wafer 200. The film thickness of the HfN film can be controlled by adjusting the number of times of executing the cycle.

The processing condition of the wafer 200 in the film forming step in this embodiment is as follows:
Wafer temperature: 100 to 300° C.
Pressure in the processing chamber: 0.1 to 1000 Pa
NH$_3$ supply flow rate: 50 to 10000 sccm
H$_2$ supply flow rate: 50 to 10000 sccm
HfCl$_4$ supply flow rate: 10 to 500 sccm
N$_2$ supply flow rate: 50 to 10000 sccm According to this embodiment, one or a plurality of effects are exhibited out of the effects shown below.

According to this embodiment, the HfN layer is formed on the wafer 200 by intermittently and alternately supplying the HfCl$_4$ gas and the NH$_3$ gas and simultaneously supplying the NH$_3$ gas and the H$_2$ gas at this time. As described above, Cl contained in the HfCl$_4$ gas is sometimes remained in the HfN layer formed on the wafer 200. However, the Cl remained in the HfN layer is reacted with the H$_2$ gas supplied into the processing chamber 201, and is turned into the HCl gas, and is removed from the HfN layer, to thereby modify the HfN layer. As a result, in the HfN film of this embodiment, the Cl concentration in the film is reduced, compared with the HfN film formed by the technique of not performing supply of the H$_2$ gas shown in FIG. 5(b), and the film quality can be improved.

Further, according to this embodiment, the HfCl$_4$ gas and the NH$_3$ gas are intermittently and alternately supplied into the processing chamber 201, and the thickness of the HfN layer formed per one alternate supply of the HfCl$_4$ gas and the NH$_3$ gas (thickness of the HfN layer formed per one cycle), is set to less than one atomic layer to not more than several atomic layers (2 nm or less). Thus, the effect of removing the residual chlorine (Cl) by the H$_2$ gas can reach the whole body of the film, and the Cl concentration in the HfN film can be surely reduced.

Further, according to this embodiment, the H$_2$ gas being the hydrogen-containing gas is used as the modifying gas. Thus, Cl in the HfN layer can be removed thermally without using plasma, namely under the non-plasma atmosphere.

Third Embodiment of the Present Invention

In the film forming step of the first embodiment, the NH$_3$ gas and the H$_2$ gas are simultaneously supplied. However, in the film forming step of this embodiment, the NH$_3$ gas and the H$_2$ gas are separately supplied, namely, the H$_2$ gas is supplied during stop of supply of the NH$_3$ gas (during intermittent period), and during stop of supply of the HfCl$_4$ gas. This point is different from the first embodiment. Meanwhile, the HfCl$_4$ gas is intermittently supplied during supply of the NH$_3$ gas. This point is the same as the first embodiment. The film forming step of this embodiment will be more specifically described hereafter, with reference to FIG. 6(a).

First, the valves vb1, vb2, vb3 are opened, to thereby start supply of the NH$_3$ gas into the processing chamber 201. The NH$_3$ gas with the flow rate controlled by the MFC 222b is dispersed by the shower head 240, and is supplied into the processing chamber 201, and flows through the exhaust duct 259, and is exhausted to the exhaust port 260. During supply of the NH$_3$ gas into the processing chamber 201, preferably the valves vd3, ve3 are left opened to prevent the invasion of the NH$_3$ gas and the H$_2$ gas into the source gas supply tube 213a and the hydrogen-containing gas supply tube 213c, and promote the dispersion of the NH$_3$ gas and the H$_2$ gas in the processing chamber 201, to thereby always flow the N$_2$ gas in the processing chamber 201.

When the specific time is elapsed after start of the NH$_3$ gas and the inside of the processing chamber 201 is set in a mixed gas atmosphere of the NH$_3$ gas and the N$_2$ gas, the valve va4 is closed and the valve va3 is opened, to thereby start supply of the HfCl$_4$ gas into the processing chamber 201. The HfCl$_4$ gas is dispersed by the shower head 240 and is supplied into the processing chamber 201, flows through the exhaust duct 259, and is exhausted to the exhaust port 260. During supply of the HfCl$_4$ gas into the processing chamber 201, the valves vb3, vd3, ve3 are left opened, to thereby always flow the NH$_3$ gas and the N$_2$ gas in the processing chamber 201. When the specific time is elapsed after start of supply of the HfCl$_4$ gas, the valve va3 is closed and the valve va4 is opened, to thereby stop supply of the HfCl$_4$ gas into the processing chamber 201. The intermittent supply of the HfCl$_4$ gas is executed the specific number of times (for example, twice in FIG. 6(a)).

The HfCl$_4$ gas intermittently supplied into the processing chamber 201, is reacted with the NH$_3$ gas in the processing chamber 201, to thereby generate HfN and HCl gases. Then, the generated HfN is deposited on the wafer 200, to thereby form the HfN layer having the specific thickness on the wafer 200. The HCl gas generated in the processing chamber 201 flows through the exhaust duct 259, and is exhausted to the exhaust port 260.

A total thickness of the HfN layer formed by executing the intermittent supply of the $HfCl_4$ gas the specific number of times, is preferably set to less than one atomic layer to 2 nm or less. This is because when the total thickness of the HfN layer exceeds 2 nm, the effect of removing the residual chlorine (Cl) by the $H_2$ gas descried later, cannot reach the whole body of the HfN layer.

When the specific time is elapsed after intermittent supply of the $HfCl_4$ gas, the valve vb3 is closed to thereby stop supply of the $NH_3$ gas into the processing chamber 201. At this time, the valves vd3, ve3 are left opened, to thereby continuously perform supply of the $N_2$ gas into the processing chamber 201. Thus, the inside of the processing chamber 201 is purged by the $N_2$ gas, and gases or reaction byproducts remained in the processing chamber 201 is removed.

After completion of the purge of the inside of the processing chamber 201, the valves vc1, vc2, vc3 are opened, to thereby start supply of the $H_2$ gas into the processing chamber 201, namely, start the irradiation of the $H_2$ gas to the wafer 200. The $H_2$ gas with the flow rate controlled by the MFC 222c is dispersed by the shower head 240 and is supplied into the processing chamber 201, and flows through the exhaust duct 259, and is exhausted to the exhaust port 260. During supply of the $H_2$ gas into the processing chamber 201, preferably the valves vd3, ve3 are left opened to prevent the invasion of the $H_2$ gas into the source gas supply tube 213a and the nitrogen-containing gas supply tube 213b, and promote the dispersion of the $H_2$ gas in the processing chamber 201, to thereby always flow the $N_2$ gas in the processing chamber 201. When the specific time is elapsed after supply of the $H_2$ gas, the valve vc3 is closed to thereby stop supply of the $H_2$ gas into the processing chamber 201.

As described above, Cl contained in the $HfCl_4$ gas is sometimes remained in the HfN layer formed on the wafer 200. However, the Cl in the HfN layer is reacted with the $H_2$ gas supplied into the processing chamber 201, and is turned into the HCl gas, and is removed from the HfN layer, to thereby modify the HfN layer. The generated HCl gas flows through the exhaust duct 259 and is exhausted to the exhaust port 260.

When the valve vc3 is closed to thereby stop supply of the $H_2$ gas into the processing chamber 201, the valves vd3, ve3 are left opened, to thereby continuously perform supply of the $N_2$ gas into the processing chamber 201. The $N_2$ gas is supplied into the processing chamber 201 through the shower head 240, and flows through the exhaust duct 259, and is exhausted to the exhaust port 260. Thus, the inside of the processing chamber 201 is purged again by the $N_2$ gas, and gases or reaction byproducts remained in the processing chamber 201 is removed. At this time, the inside of the processing chamber 201 may be vacuumed instead of purging the inside of the processing chamber 201 by the $N_2$ gas, or before or after purging the inside of the processing chamber 201 by the $N_2$ gas. By vacuuming the inside of the processing chamber 201, the Cl remained in the HfN layer from which Cl is removed by the action of the $H_2$ gas, can be further removed.

Then, the HfN film having the specific film thickness is formed on the wafer 200 by performing the above-mentioned gas supply sequence (from start of supply of the $NH_3$ gas into the processing chamber 201, to the completion of the second purging of the inside of the processing chamber 201) the specific number of times, preferably multiple numbers of times. Namely, the HfN film is formed on the wafer 200 by performing the specific number of times, preferably multiple numbers of times, a cycle of forming the HfN layer on the wafer 200 by intermittently supplying the $HfCl_4$ gas during supply of the $NH_3$ gas; and modifying the HfN layer by supplying the $H_2$ gas during stop of supply of the $NH_3$ gas, namely during stop of supply of the $HfCl_4$ gas, with this sequence as one cycle. The film thickness of the HfN film can be controlled by adjusting the number of times of executing the cycle.

The processing conditions of the wafer 200 in the film forming step of this embodiment are as follows:
Wafer temperature: 300 to 500° C.
Pressure in the processing chamber: 0.1 to 1000 Pa
$NH_3$ supply flow rate: 50 to 10000 sccm
$H_2$ supply flow rate: 50 to 10000 sccm
$HfCl_4$ supply flow rate: 10 to 500 sccm
$N_2$ supply flow rate: 50 to 10000 sccm According to this embodiment, one or a plurality of effects are exhibited out of the effects shown below.

According to this embodiment, the HfN layer is formed on the wafer 200 by intermittently supplying the $HfCl_4$ gas during supply of the $NH_3$ gas, and supplying the $H_2$ gas during stop of supply of the $HfCl_4$ gas, and during stop of supply of the $NH_3$ gas. As described above, Cl contained in the $HfCl_4$ gas is sometimes remained in the HfN layer formed on the wafer 200. However, the Cl remained in the HfN layer is reacted with the $H_2$ gas supplied into the processing chamber 201, and is turned into the HCl gas, and is removed from the HfN layer, to thereby modify the HfN layer. As a result, in the HfN film of this embodiment, the Cl concentration in the film is reduced compared with the HfN film formed by the technique of not performing supply of the $H_2$ gas shown in FIG. 6(b), and the film quality can be improved.

Further, according to this embodiment, the total thickness of the HfN layer formed by intermittently supplying the $HfCl_4$ gas the specific number of times during supply of the $NH_3$ gas into the processing chamber 201 (thickness of the HfN layer formed per one cycle), is set to less than one atomic layer to not more than several atomic layers (2 nm or less). Thus, the effect of removing the residual chlorine (Cl) by the $H_2$ gas can reach the whole body of the film, and the Cl concentration in the HfN film can be surely reduced.

Further, according to this embodiment, the $H_2$ gas being the hydrogen-containing gas is used as the modifying gas. Thus, Cl in the HfN layer can be removed thermally without using plasma, namely under the non-plasma atmosphere.

Fourth Embodiment of the Present Invention

Figure 7:
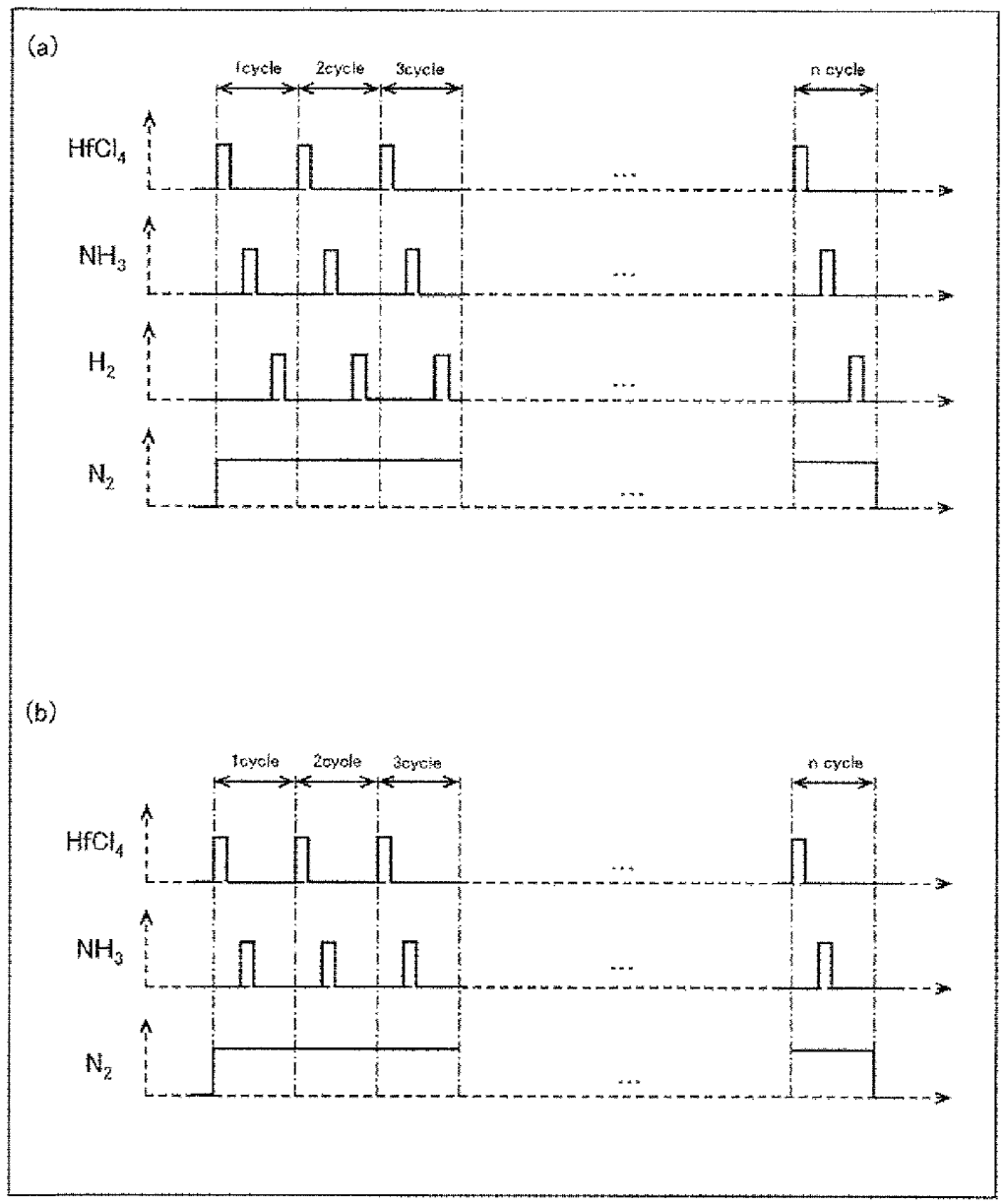
FIG. 7(a) is a timing chart showing a gas supply sequence according to a fourth embodiment of the present invention.
FIG. 7(b) is a timing chart showing the gas supply sequence in which supply of the $H_2$ gas is not performed.

In the film forming step of the second embodiment, the $NH_3$ gas and the $H_2$ gas are simultaneously supplied. However, in the film forming step of this embodiment, the $NH_3$ gas and the $H_2$ gas are separately supplied, namely, the $H_2$ gas is supplied during stop of supply of the $NH_3$ gas, and during stop of supply of the $HfCl_4$ gas. This point is different from the second embodiment. Meanwhile, the $HfCl_4$ gas and the $NH_3$ gas are alternately supplied, and the processing temperature and the processing pressure in the processing chamber 201 are set to the processing temperature and the processing pressure allowing the HfN film to be formed by the ALD method. This point is the same as the second embodiment. The film forming step of this embodiment will be more specifically described hereafter, with reference to FIG. 7(a).

First, the valve va4 is closed and the valve va3 is opened, to thereby start supply of the $HfCl_4$ gas into the processing chamber 201, namely, the irradiation of the $HfCl_4$ gas to the wafer 200. The $HfCl_4$ gas is dispersed by the shower head 240 and is uniformly supplied onto the wafer 200 in the processing chamber 201. The gas molecules of the $HfCl_4$ are adsorbed on the wafer 200, to thereby form the Hf-containing layer. The excess HfCl$_4$ gas flows through the exhaust duct 259, and is exhausted to the exhaust port 260. Preferably, the valves vd3 and ve3 are left opened, to always flow the N$_2$ gas in the processing chamber 201 during supply of the HfCl$_4$ gas into the processing chamber 201, so as to prevent the invasion of the HfCl$_4$ gas into the nitrogen-containing gas supply tube 213b and the hydrogen-containing gas supply tube 213c, and promote the dispersion of the HfCl$_4$ gas in the processing chamber 201. When the specific time is elapsed after the valve va3 is opened to thereby start supply of the HfCl$_4$ gas, the valve va3 is closed and the valve va4 is opened, to thereby stop supply of the HfCl$_4$ gas into the processing chamber 201.

After the valve va3 is closed, to thereby stop supply of the HfCl$_4$ gas into the processing chamber 201, the valves vd3, ve3 are left opened, to thereby continuously perform the supply the N$_2$ gas into the processing chamber 201. The N$_2$ gas is supplied into the processing chamber 201 through the shower head 240, and flows through the exhaust duct 259 and is exhausted to the exhaust port 260. Thus, the inside of the processing chamber 201 is purged by the N$_2$ gas, and the HfCl$_4$ gas remained in the processing chamber 201 is removed.

When the purge of the inside of the processing chamber 201 is completed, the valves vb1, vb2, vb3 are opened, to thereby start supply of the NH$_3$ gas into the processing chamber 201, namely irradiation of the NH$_3$ gas to the wafer 200. The NH$_3$ gas with the flow rate controlled by the MFC 222b is dispersed by the shower head 240 and is uniformly supplied onto the wafer 200 in the processing chamber 201, and flows through the exhaust duct 259 and is exhausted to the exhaust port 260. During supply of the NH$_3$ gas into the processing chamber 201, preferably the valves vd3, ve3 are left opened to prevent the invasion of the NH$_3$ gas into the source gas supply tube 213a and the hydrogen-containing gas supply tube 213c, and promote the dispersion of the NH$_3$ gas in the processing chamber 201, to thereby always flow the N$_2$ gas in the processing chamber 201. When the specific time is elapsed after the valves vb1, vb2, vb3, are opened and supply of the NH$_3$ gas is started, the valve vb3 is closed, to thereby stop supply of the NH$_3$ gas into the processing chamber 201.

The NH$_3$ gas supplied into the processing chamber 201 is reacted with the Hf-containing layer formed on the wafer 200, to thereby form the HfN layer of less than one atomic layer to not more than several atomic layers (2 nm or less) on the wafer 200, and the HCl gas is generated. The generated HCl gas flows through the exhaust duct 259 and is exhausted to the exhaust port 260.

When the valve vb3 is closed to thereby stop supply of the NH$_3$ gas into the processing chamber 201, the valves vd3, ve3 are left opened, to thereby continuously perform supply of the N$_2$ gas into the processing chamber 201. The N$_2$ gas is supplied into the processing chamber 201 through the shower head 240, and flows through the exhaust duct 259, and is exhausted to the exhaust port 260. Thus, the inside of the processing chamber 201 is purged again by the N$_2$ gas, to thereby remove gases or reaction byproducts remained in the processing chamber 201.

When the purge of the inside of the processing chamber 201 is completed, the valves vc1, vc2, vc3 are opened, to thereby start supply of the H$_2$ gas into the processing chamber 201, namely, the irradiation of the H$_2$ gas to the wafer 200. The H$_2$ gas with the flow rate controlled by the MFC 222c is dispersed by the shower head 240 and is uniformly supplied onto the wafer 200 in the processing chamber 201, and flows through the exhaust duct 259 and is exhausted to the exhaust port 260. During supply of the H$_2$ gas into the processing chamber 201, preferably the valves vd3, ve3 are left opened to prevent the invasion of the H$_2$ gas into the source gas supply tube 213a and the nitrogen-containing gas supply tube 213b, and promote the dispersion of the H$_2$ gas in the processing chamber 201, to thereby always flow the N$_2$ gas in the processing chamber 201. When the valves vc1, vc2, vc3 are opened and the specific time is elapsed after supply of the H$_2$ gas, the valve vc3 is closed to thereby stop supply of the H$_2$ gas into the processing chamber 201.

As described above, Cl contained in the HfCl$_4$ gas is sometimes remained in the HfN layer formed on the wafer 200. However, the Cl in the HfN layer is reacted with the H$_2$ gas supplied into the processing chamber 201 and is turned into the HCl gas and is removed from the HfN layer, to thereby modify the HfN layer. The generated HCl gas flows through the exhaust duct 259 and is exhausted to the exhaust port 260.

After the valve vc3 is closed to thereby stop supply of the H$_2$ gas into the processing chamber 201, the valves vd3, ve3 are left opened, to thereby continuously perform supply of the N$_2$ gas into the processing chamber 201. The N$_2$ gas is supplied into the processing chamber 201 through the shower head 240, and flows through the exhaust duct 259 and is exhausted to the exhaust port 260. Thus, the inside of the processing chamber 201 is purged again by the N$_2$ gas, to thereby remove gases or reaction byproducts remained in the processing chamber 201.

Then, the HfN film having the specific film thickness is formed on the wafer 200 by performing the above-mentioned gas supply sequence (from start of supply of the HfCl$_4$ gas into the processing chamber 201, to the completion of the second purge of the inside of the processing chamber 201) the specific number of times, preferably multiple numbers of times. Namely, the HfN film is formed on the wafer 200 by performing the specific number of times, preferably multiple numbers of times, a cycle of making the HfCl$_4$ gas adsorbed on the wafer 200 by supplying the HfCl$_4$ gas; forming the HfN layer on the wafer 200 by supplying the NH$_3$ gas and making it reacted with the HfCl$_4$ gas adsorbed on the wafer 200; and modifying the HfN layer by supplying the H$_2$ gas, with this cycle set as one cycle. The film thickness of the HfN film can be controlled by adjusting the number of times of executing the cycle.

The processing conditions of the wafer 200 in the film forming step of this embodiment are as follows for example:
Wafer temperature: 100 to 300° C.
Pressure in the processing chamber: 0.1 to 1000 Pa
NH$_3$ supply flow rate: 50 to 10000 sccm
H$_2$ supply flow rate: 50 to 10000 sccm
HfCl$_4$ supply flow rate: 10 to 500 sccm
N$_2$ supply flow rate: 50 to 10000 sccm According to this embodiment, one or a plurality of effects are exhibited out of the effects shown below.

According to this embodiment, the HfN layer is formed on the wafer 200 by intermittently and alternately supplying the HfCl$_4$ gas and the NH$_3$ gas, and supplying the H$_2$ gas during stop of supply of the HfCl$_4$ gas, and during stop of supply of the NH$_3$ gas. As described above, Cl contained in the HfCl$_4$ gas is sometimes remained in the HfN layer. However, the Cl remained in the HfN layer is reacted with the H$_2$ gas supplied into the processing chamber 201, and is turned into the HCl gas, and is removed from the HfN layer, to thereby modify the HfN layer. As a result, the HfN film of this embodiment contains reduced Cl concentration in the film and is improved in the film quality, compared with the HfN film formed by a technique of not performing supply of the H$_2$ gas shown in FIG. 7(b).

Further, according to this embodiment, the $HfCl_4$ gas and the $NH_3$ gas are intermittently and alternately supplied into the processing chamber 201, and the thickness of the HfN layer formed per one alternate supply of the $HfCl_4$ gas and the $NH_3$ gas (thickness of the HfN layer formed per one cycle), is set to less than one atomic layer to not more than several atomic layers (2 nm or less). Thus, the effect of removing the residual chlorine (Cl) by the $H_2$ gas can reach the whole body of the film, and the Cl concentration in the HfN film can be surely reduced.

Further, according to this embodiment, the $H_2$ gas being the hydrogen-containing gas is used as the modifying gas. Thus, Cl in the HfN layer can be removed thermally without using plasma, namely under the non-plasma atmosphere.

Further Other Embodiment of the Present Invention

As described above, embodiments of the present invention have been specifically described. However, the present invention is not limited to the above-mentioned embodiments, and can be variously modified in a range not departing from the gist of the invention.

Figure 10:
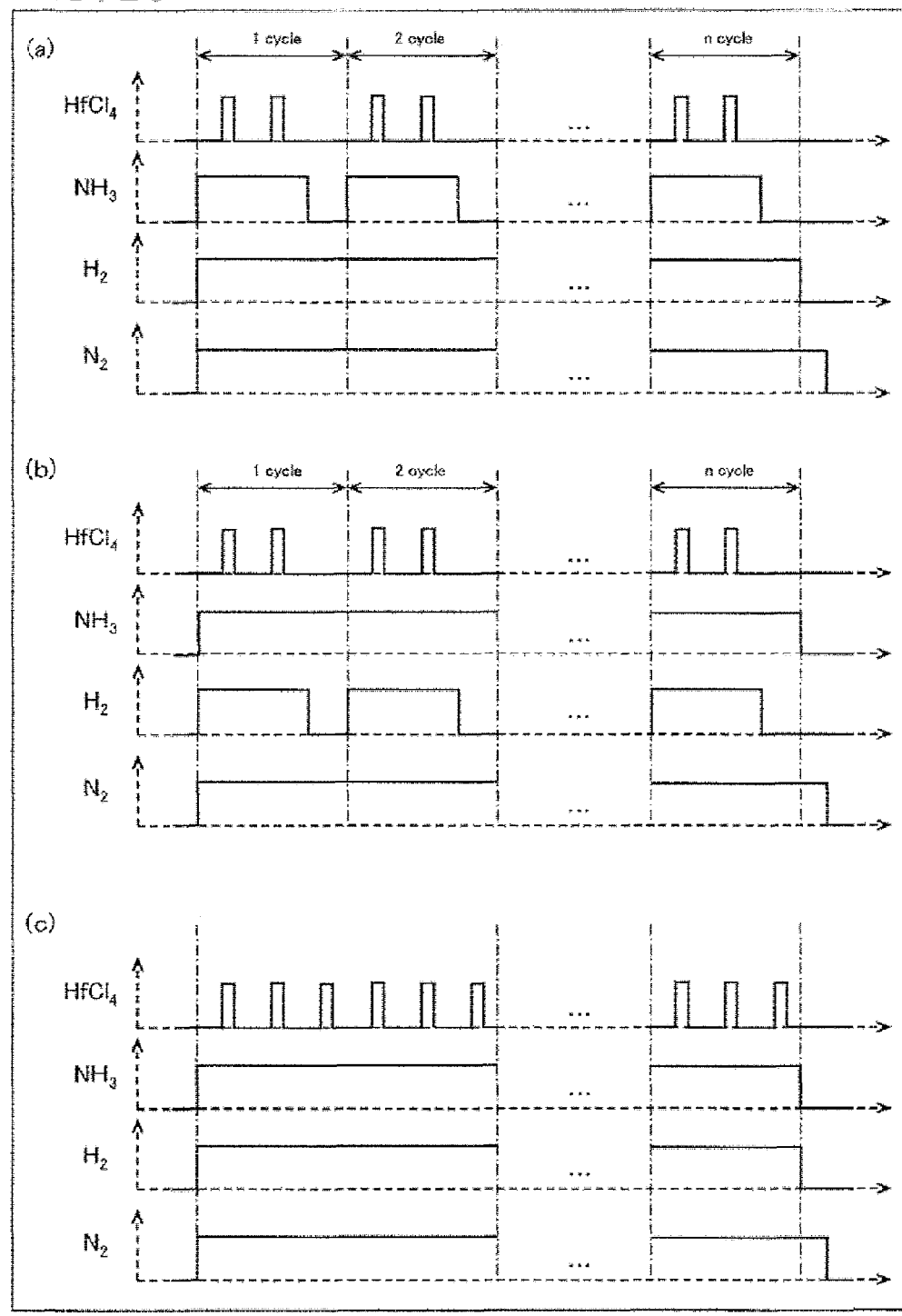
FIG. 10 is a timing chart showing a gas supply sequence according to further other embodiment of the present invention.

For example, in the above-mentioned first embodiment, explanation is given for an example of performing the specific number of times, the cycle of intermittently supplying the $HfCl_4$ gas during supply of the $NH_3$ gas and the $H_2$ gas; and purging the inside of the processing chamber 201 by the $N_2$ gas, with this sequence set as one cycle. However, the present invention is not limited thereto. For example, as shown in FIG. 10(a), purging of the inside of the processing chamber 201 by the $N_2$ gas during film formation may be omitted, and instead, the $H_2$ gas may be continuously supplied. Further, as shown in FIG. 10(b), purging the inside of the processing chamber 201 by the $N_2$ gas during film formation may be omitted, and instead, the $NH_3$ gas may be continuously supplied. Also, as shown in FIG. 10(c), purging the inside of the processing chamber 201 by the $N_2$ gas during film formation may be omitted, and instead, the $H_2$ gas and the $NH_3$ gas may be continuously supplied. In any case of FIG. 10(a), FIG. 10(b), and FIG. 10(c), after formation of the HfN film having the specific film thickness, purging of the inside of the processing chamber 201 by the $N_2$ gas is performed.

Figure 11:
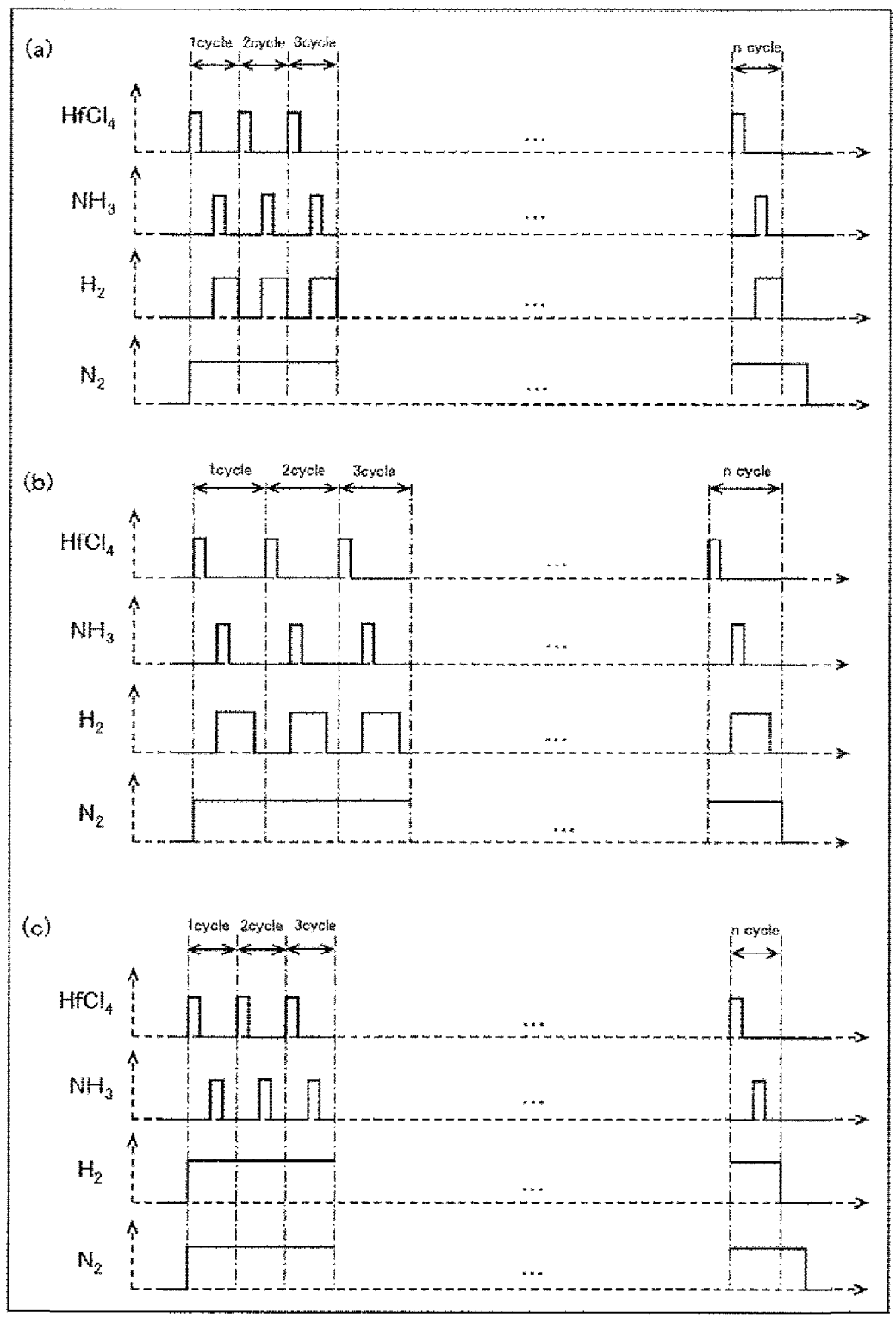
FIG. 11 is a timing chart showing a gas supply sequence according to further other embodiment of the present invention.

Further for example, in the above-mentioned second embodiment, explanation is given for an example of intermittently and alternately supplying the $HfCl_4$ gas and the $NH_3$ gas, and at this time simultaneously supplying the $NH_3$ gas and the $H_2$ gas. However, the present invention is not limited thereto. For example, as shown in FIG. 11(a), supply of the $H_2$ gas may be continued even after stop of supply of the $NH_3$ gas. In this case, as shown in FIG. 11(b), the inside of the processing chamber 201 may be purged by the $N_2$ gas after stop of supply of the $H_2$ gas. Further, as shown in FIG. 11(c), the $H_2$ gas may be continuously supplied. In each case of FIG. 11(a) and FIG. 11(c), the inside of the processing chamber 201 is purged by the $N_2$ gas after formation of the HfN film having the specific film thickness.

In this case, as described above, the $H_2$ gas is supplied when the $NH_3$ gas is supplied, namely, in the process of forming the HfN layer. Therefore, when the extremely thin HfN layer is formed, Cl in such an extremely thin HfN layer can be immediately removed by the action of the $H_2$ gas. Namely, Cl in the HfN layer can be removed when the thickness of the HfN layer is extremely thin. Such a reaction, namely, formation of the extremely thin HfN layer and removal of the Cl from the extremely thin HfN layer, are continuously performed during supply of the $NH_3$ gas.

Further, the $H_2$ gas is supplied after stop of supply of the $HfCl_4$ gas, namely, even after formation of the HfN layer, and therefore as described above, the Cl remained in the HfN layer which is formed while removing the Cl during supply of the $NH_3$ gas, can be further removed by the action of the $H_2$ gas.

Further for example, in the above-mentioned embodiment, explanation is given for an example of supplying the hydrogen-containing gas from the hydrogen-containing gas supply system. However, the hydrogen-containing gas is used as a carrier gas of the $HfCl_4$ gas, and may be supplied from the source gas supply system. Further, the hydrogen-containing gas is used as the carrier gas of the nitrogen-containing gas, and may be supplied from the nitrogen-containing gas supply system. Thus, by using the hydrogen-containing gas as the carrier gas, the gas supply system can be simplified.

Further for example, in the above-mentioned embodiment, explanation is given for an example of using the $HfCl_4$ as the source containing the hafnium element. However, the present invention is not limited thereto. For example, as the source containing the hafnium element, organic metal sources such as tetrakis(ethylmethylamino)hafnium $(Hf[N(C_2H_5)(CH_3)]_4$, abbreviated as TEMAH), tetrakis(dimethylamino) hafnium $(Hf[N(CH_3)_2]_4$, abbreviated as TDMAH), tetrakis (diethylamino)hafnium $(Hf[N(C_2H_5)_2]_4$, abbreviated as TDEAH), etc., can be used.

Further for example, in the above-mentioned embodiment, explanation is given for a case of forming the HfN film as the metal nitride film. However, the present invention is not limited thereto, and can be suitably applied to a case of forming a titanium nitride (TiN) film, a tantalum nitride (TaN) film, a zirconium nitride (ZrN) film, a molybdenum nitride (MoN) film, a tungsten nitride (WN) film, and a vanadium nitride (VN) film, etc., as the metal nitride film.

In this case, the film formation can be performed based on the film formation sequence similar to the above-mentioned embodiment, using the source containing each metal element as the source gas. When using the liquid source in the liquid state under normal temperature and pressure, the liquid source is vaporized by a vaporization system such as a vaporizer or a bubbler, and is supplied as the source gas. A similar gas as the gas of the above-mentioned embodiment can be used as the nitrogen-containing gas and the hydrogen-containing gas. Also, a similar processing condition as the condition of the above-mentioned embodiment can be used.

For example, when a TiN film is formed, titanium tetrachloride $(TiCl_4)$, tetrakis(ethylmethylamino)titanium $(Ti[N(C_2H_5)(CH_3)]_4$, abbreviated as TEMAT), tetrakis(dimethylamino)titanium $(Ti[N(CH_3)_2]_4$, abbreviated as TDMAT), tetrakis(diethylamino)titanium $(Ti[N(C_2H_5)_2]_4$, abbreviated as TDEMAT), etc., can be used as the source.

Further for example, when a TaN film is formed, tantalum pentachloride $(TaCl_5)$, tantalum pentafluoride $(TaF_5)$, pentaethoxytantalum $(Ta(OC_2H_5)_5$, abbreviated as PET), tris(diethylamino)tertially butyl imino tantalum $(Ta(NC(CH_3)_3)(N(C_2H_5)_2)_3$, abbreviated as TBTDET), etc., can be used as the source.

Further for example, when a ZrN film is formed, zirconium tetrachloride $(ZrCl_4)$, tetrakis(ethylmethylamino)zirconium $(Zr[N(C_2H_5)(CH_3)]_4$, abbreviated as TEMAZ), tetrakis(dimethylamino)zirconium $(Zr[N(CH_3)_2]_4$, abbreviated as TDMAZ), tetrakis(diethylamino)zirconium $(Zr[N(C_2H_5)_2]_4$, abbreviated as TDEAZ), etc., can be used as the source.

Further for example, when a MoN film is formed, molybdenum pentachloride $(MoCl_5)$, and molybdenum pentafluoride $(MoF_5)$, etc., can be used as the source.

Further for example, when a WN film is formed, tungsten hexachloride ($WCl_6$), and tungsten hexafluoride ($WF_6$), etc., can be sued as the source.

Further for example, when a VN film is formed, vanadium trichloride ($VCl_3$) and vanadium trifluoride ($VF_3$), etc., can be used as the source.

Further for example, in the above-mentioned embodiment, explanation is given for an example of using the chlorine-based gas containing Cl as the source gas. However, the present invention is not limited thereto, and can be suitably applied to a case of using a fluorine gas containing F as the source gas. Namely, the present invention can be suitably applied to a case of using a gas containing a halogen element such as Cl and F, etc., namely using a halogen-based gas.

Further for example, in the above-mentioned embodiment, explanation is given for an example of using a single wafer processing Cold Wall type substrate processing apparatus configured to process one substrate at once. However, the present invention is not limited thereto. For example, the present invention can be suitably applied to a case of using a single wafer processing Hot Wall type substrate processing apparatus, or a batch Hot Wall type substrate processing apparatus configured to process a plurality of substrates at once. Such a batch Hot Wall type substrate processing apparatus will be described hereafter.

FIG. 9 is a schematic block diagram of a vertical processing furnace of a vertical device suitably used in this embodiment, and FIG. 9(a) shows a processing furnace 302 part in a vertical sectional face, and FIG. 9(b) shows the processing furnace 302 part taken along the line A-A of FIG. 9(a).

As shown in FIG. 9(a), the processing furnace 302 includes a heater 307 as a heating unit (heating mechanism). The heater 307 has a cylindrical shape, and is vertically installed on a heater base (not shown) as a holding plate by being supported thereby.

A process tube 303 as a reaction tube, is disposed inside of the heater 307 concentrically with the heater 307. The process tube 303 is made of a heat-resistant material such as quartz ($SiO_2$) or silicon carbide (SiC), etc., for example, and is formed into a cylindrical shape with an upper end closed and a lower end opened. A processing chamber 301 is formed in cylinder hollow part of the process tube 303, and is configured to house the wafer 200 being the substrate in a horizontal posture by a boat 317 described later, so as to be vertically arranged in multiple stages.

A manifold 309 is disposed in a lower part of the process tube 303, concentrically with the process tube 303. The manifold 309 is made of stainless, etc., for example, and is formed into the cylindrical shape with the upper end and the lower end opened. The manifold 309 is engaged with the process tube 303, and is provided so as to support the process tube 303. An O-ring 320a as a seal member, is provided between the manifold 309 and the process tube 303. The manifold 309 is set in a state of being vertically installed on the heater base by being supported thereby. A reaction vessel is formed by the process tube 303 and the manifold 309.

A first nozzle 333a being a first gas introduction part, and a second nozzle 333b being a second gas introduction part, are connected to the manifold 309 so as to pass through a side wall of the manifold 309. Each of the first nozzle 333a and the second nozzle 333b is formed into a L-shape having a horizontal part and a vertical part respectively, with the horizontal part connected to the manifold 309, and the vertical part provided in an arc-shaped space between the inner wall of the process tube 303 and the wafer 200 so as to rise toward a stacking direction of the wafers 200, along the inner wall extending from a lower part to an upper part of the process tube 303. First gas supply holes 348a and second gas supply holes 348b being the supply holes for supplying a gas, are respectively provided on side faces of the vertical parts of the first nozzle 333a and the second nozzle 333b. The first gas supply holes 348a and the second gas supply holes 348b have respectively the same opening area extending from the lower part to the upper part, and are further provided at the same opening pitch.

The gas supply system connected to the first nozzle 333a and the second nozzle 333b is the same as that of the above-mentioned embodiment. However, in this embodiment, the source gas supply tube 213a and the inert gas supply tube 213e are connected to the first nozzle 333a, and the nitrogen-containing gas supply tube 213b and the hydrogen-containing gas supply tube 213c, and the inert gas supply tube 213d are connected to the second nozzle 333b. This point is different from the above-mentioned embodiment. Namely, in this embodiment, the source gas, and the nitrogen-containing gas and the hydrogen-containing gas are supplied through different nozzles. Further, the nitrogen-containing gas and the hydrogen-containing gas may be supplied through different nozzles.

An exhaust tube 331 for exhausting an atmosphere in the processing chamber 301, is provided in the manifold 309. A vacuum pump 346 as a vacuum exhausting device is connected to the exhaust tube 331 through a pressure sensor 345 as a pressure detector and an APC (Auto Pressure Controller) valve 342 as a pressure adjuster, so that the inside of the processing chamber 301 is vacuum-exhausted to set the pressure in the processing chamber 301 to a specific pressure (degree of vacuum) by adjusting the APC valve 342 based on pressure information detected by the pressure sensor 345. The APC valve 342 is an open/close valve configured to perform vacuum-exhaust/stop of vacuum exhaust of the inside of the processing chamber 301 by opening/closing the valve, and adjust the pressure in the processing chamber 301 by further adjusting a valve opening degree.

A seal cap 319 as a furnace throat lid member capable of air-tightly close a lower end opening of the manifold 309, is provided in a lower part of the manifold 309. The seal cap 319 is configured to be abutted on the lower end of the manifold 309 from a vertical lower side. The seal cap 319 is made of metal such as stainless for example, and is formed into a disc shape. An O-ring 320b as a seal member abutted on the lower end of the manifold 309, is provided on an upper surface of the seal cap 319. A rotation mechanism 367 for rotating the boat 317 described later, is installed on an opposite side of the processing chamber 301 across the seal cap 319. A rotation shaft 355 of the rotation mechanism 367 passes through the seal cap 319, and is connected to the boat 317, so that the wafer 200 is rotated by rotating the boat 317. The seal cap 319 is configured to be vertically elevated by a boat elevator 315 as an elevation mechanism disposed outside of the process tube 303. Thus, the boat 317 can be loaded and unloaded into/from the processing chamber 301.

The boat 317 as a substrate holder, is made of the heat-resistant material such as quartz or silicon carbide, etc., for example, and is configured to hold a plurality of wafers 200 in the horizontal posture, so as to be arranged in multiple stages, with centers thereof aligned. A heat-insulating member 318 made of the heat-resistant material such as quartz or silicon carbide, etc., is provided in a lower part of the boat 317, so that a heat from the heater 307 is hardly transmitted to the seal cap 319 side. A temperature sensor 363 as a temperature detector, is installed in the process tube 303, so that the temperature in the process chamber 301 has a specific temperature distribution by adjusting a power supply condition to the heater 307 based on temperature information detected by the temperature sensor 363. Similarly to the first nozzle 333a and the second nozzle 333b, the temperature sensor 363 is provided along the inner wall of the process tube 303.

Similarly to the controller 280 shown in the above-mentioned embodiment, a controller 380 being a control part (control unit) includes the CPU, RAM, memory device, I/O port, and is configured as the computer connected to the input/output device. The APC valve 342, the heater 307, the temperature sensor 363, the vacuum pump 346, the rotation mechanism 367, the boat elevator 315, the valves va1 to va5, vb1 to vb3, vc1 to vc3, vd1 to vd3, ve1 to ve3, the mass flow controllers 222a, 222b, 222c, 222d, 222e, etc., are connected to the I/O port. The CPU is configured to read and execute a control program from the memory device, read a process recipe from the memory device according to an input, etc., of an operation command from the input/output device, and control each operation of the APC valve 342, the heater 307, the temperature sensor 363, the vacuum pump 345, the rotation mechanism 367, the boat elevator 315, the valves va1 to va5, vb1 to vb3, vc1 to vc3, vd1 to vd3, ve1 to ve3, and the mass flow controllers 222a, 222b, 222c, 222d, 222e, etc.

Next, explanation is given for a substrate processing step of forming a thin film on the wafer 200, as one step of a manufacturing step of the semiconductor device, using the processing furnace 302 of the vertical type apparatus having the above-mentioned structure. In the explanation given hereafter, an operation of each part constituting the vertical type apparatus, is controlled by the controller 380.

A plurality of wafers 200 are charged into the boat 317 (wafer charge). Then, as shown in FIG. 9(a), the boat 317 holding the plurality of wafers 200 is lifted by the boat elevator 315, and is loaded into the processing chamber 301 (boat loading). In this state, the seal cap 319 is set in a state of sealing the lower end of the manifold 309 through the O-ring 320b.

The inside of the processing chamber 301 is vacuum-exhausted by the vacuum pump 346 so that the inside of the processing chamber 301 is set in a desired pressure (degree of vacuum). At this time, the pressure in the processing chamber 301 is measured by the pressure sensor 345, and based on the measured pressure, the APC valve 342 is feedback-controlled. Further, the inside of the processing chamber 301 is heated by the heater 307 so as to be a desired temperature. At this time, the power supply condition to the heater 307 is feedback-controlled based on the temperature information detected by the temperature sensor 363, so that the inside of the processing chamber 301 is set to a desired temperature distribution. Subsequently, the wafer 200 is rotated by rotating the boat 317 by the rotation mechanism 367.

Thereafter, by executing a similar sequence as the gas supply sequence shown in the above-mentioned embodiment, the hafnium nitride (HfN) film as the metal nitride film, is formed on the wafer 200. Namely, the source gas and the nitrogen-containing gas are intermittently supplied into the processing chamber 301, or the source gas and the nitrogen-containing gas are intermittently and alternately supplied into the processing chamber 301, or the source gas is intermittently supplied into the processing chamber 301 during continuing of supply of the nitrogen-containing gas into the processing chamber 301, and the gas supply sequence of supplying the hydrogen-containing gas into the processing chamber 301 is executed during at least supply of the nitrogen-containing gas into the processing chamber 301, to thereby form the HfN film having the specific film thickness on the wafer 200.

Thereafter, the inside of the processing chamber 301 is purged, so that the pressure in the processing chamber 301 is returned to an atmospheric pressure, and thereafter the seal cap 319 is descended by the boat elevator 315, and the lower end of the manifold 309 is opened. Then, the wafers 200 on which the HfN film having the specific film thickness is formed, are unloaded to an outside of the process tube 303 from the lower end of the manifold 309, in a state of being held by the boat 317 (boat unloading). Thereafter, the processed wafers 200 are discharged from the boat 317 (wafer discharge).

EXAMPLES

In this example, an evaluation sample was manufactured, in which the titanium nitride (TiN) film and the HfN film were sequentially stacked on a silicon wafer, and an impurity concentration in the HfN film was measured.

Figure 6:
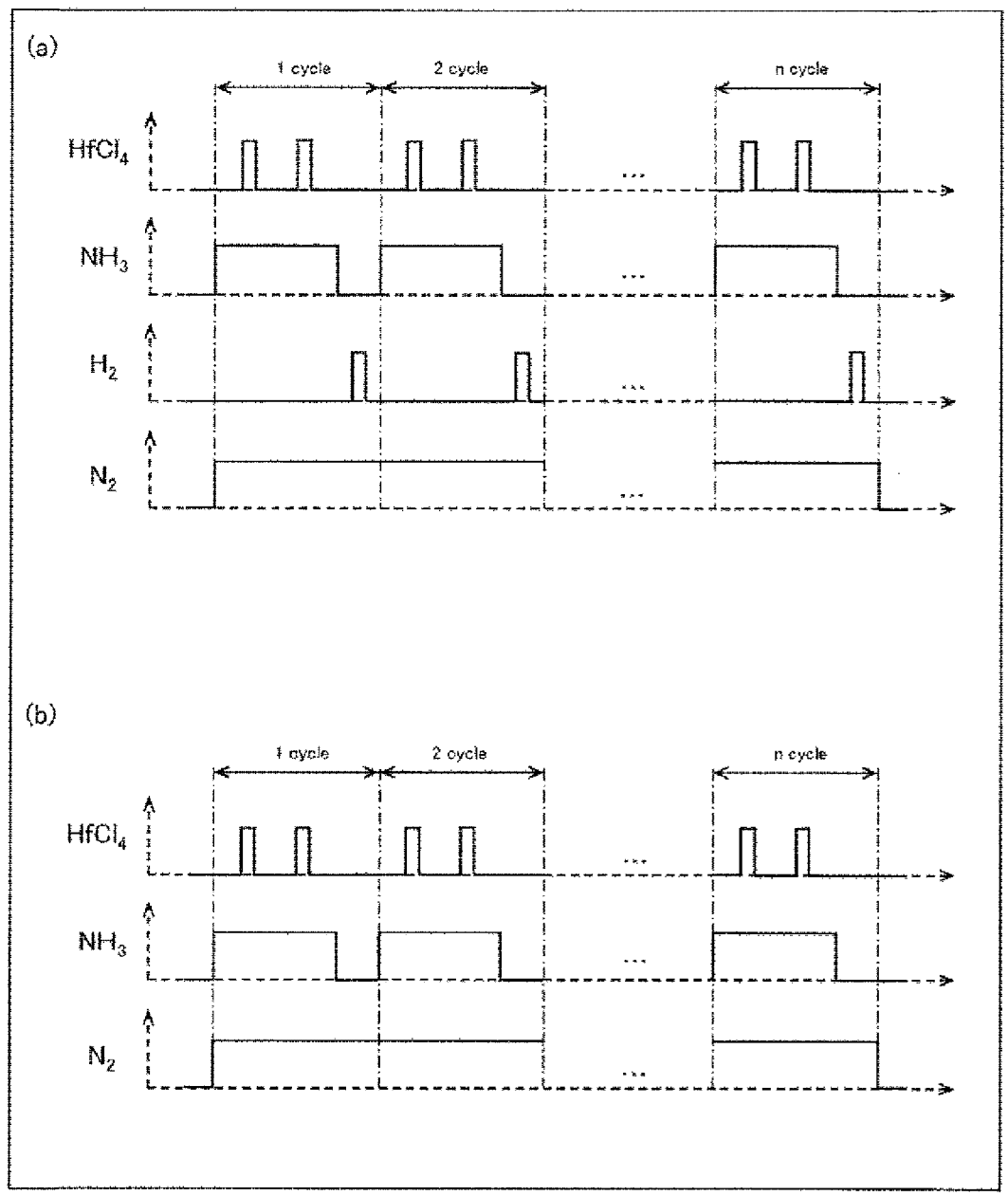
FIG. 6(a) is a timing chart showing a gas supply sequence according to a third embodiment of the present invention.
FIG. 6(b) is a timing chart showing the gas supply sequence in which supply of the $H_2$ gas is not performed.
Figure 8:
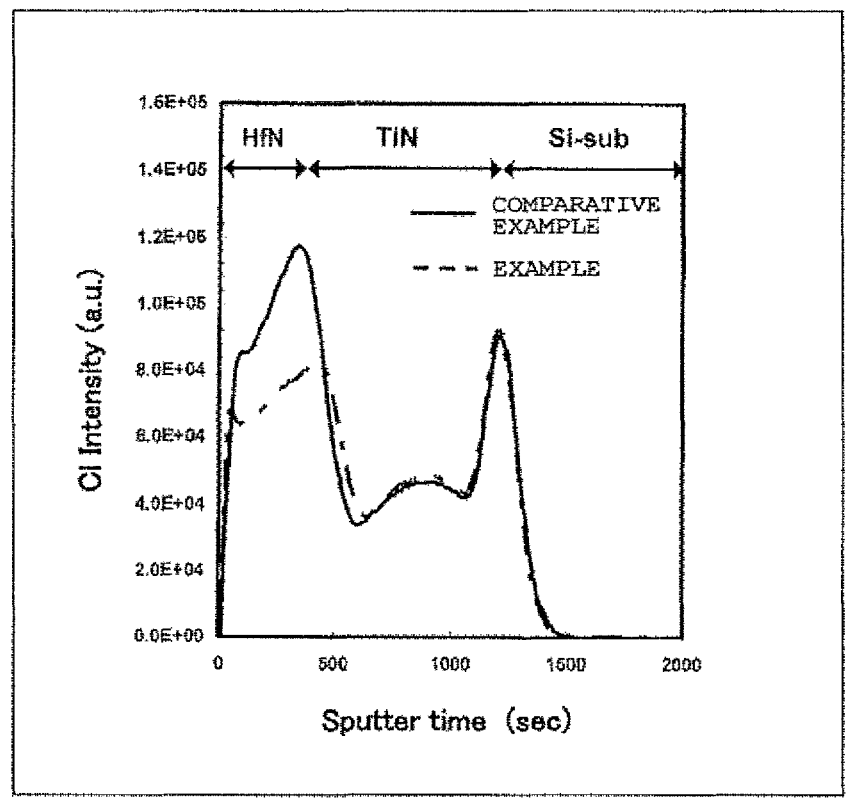
FIG. 8 is a graph showing a SIMS analysis result of an evaluation sample according to an example of the present invention and a comparative example.

The HfN film of the evaluation sample of this example, was formed using a similar technique as the technique of the third embodiment shown in FIG. 6(a), namely, the technique of intermittently supplying the HfCl$_4$ gas during supply of the NH$_3$ gas and supplying the H$_2$ gas during stop of supply of the HfCl$_4$ gas, namely, during stop of supply of the NH$_3$ gas. Further, the HfN film of the evaluation sample according to a comparative example was formed using the technique shown in FIG. 6(b), namely, the technique of not supplying the H$_2$ gas, although intermittently supplying the HfCl$_4$ gas during supply of the NH$_3$ gas. Then, SIMS (Secondary Ion-microprobe Mass Spectrometer) analysis was performed to each of the evaluation samples of the example and the comparative example. FIG. 8 is a graph showing a SIMS analysis result of the evaluation sample according to the example of the present invention and the comparative example, wherein a horizontal axis of FIG. 8 indicates an ion irradiation time (namely, observation depth from a surface of the evaluation sample) from start of the SIMS analysis, and a vertical axis of FIG. 8 indicates an observed Cl ion intensity (namely impurity concentration).

As is clarified from FIG. 8, in the evaluation sample (example: shown by broken line in the figure) in which the HfN film is formed by intermittently supplying the HfCl$_4$ gas during supply of the NH$_3$ gas, and supplying the H$_2$ gas during stop of supply of the HfCl$_4$ gas, namely, during stop of supply of the NH$_3$ gas, it is found that the Cl concentration in the HfN film is reduced, compared with the evaluation sample (comparative example: shown by solid line in the figure) in which the HfN film is formed without supplying the H$_2$ gas. Namely, the impurity concentration in the HfN film can be reduced by intermittently supplying the HfCl$_4$ gas during supply of the NH$_3$ gas, and supplying the H$_2$ gas during stop of supply of the HfCl$_4$ gas, namely during stop of supply of the NH$_3$ gas, and the film quality can be improved.

<Preferable Aspects of the Present Invention>

Preferable aspects of the present invention will be described hereafter.

(Supplementary Description 1)

According to an aspect of the present invention, there is provided a method of manufacturing a semiconductor device, including:

housing a substrate into a processing chamber; and forming a metal nitride film on the substrate by supplying a source gas containing a metal element, a nitrogen-containing gas and a hydrogen-containing gas into the processing chamber;

wherein in forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

(Supplementary Description 2)

There is provided the method of the supplementary description 1, wherein in forming the metal nitride film, the nitrogen-containing gas and the hydrogen-containing gas are simultaneously supplied.

(Supplementary Description 3)

There is provided the method of the supplementary description 2, wherein in forming the metal nitride film, the source gas is supplied during supply of the nitrogen-containing gas, and at this time, the nitrogen-containing gas and the hydrogen-containing gas are simultaneously supplied.

(Supplementary Description 4)

There is provided the method of the supplementary description 3, wherein in forming the metal nitride film, the source gas is intermittently supplied during supply of the nitrogen-containing gas, and at this time, the nitrogen-containing gas and the hydrogen-containing gas are simultaneously supplied.

(Supplementary Description 5)

There is provided the method of the supplementary description 2, wherein in forming the metal nitride film, the source gas and the nitrogen-containing gas are alternately supplied, and at this time, the nitrogen-containing gas and the hydrogen-containing gas are simultaneously supplied.

(Supplementary Description 6)

There is provided the method of the supplementary description 1, wherein in forming the metal nitride film, the hydrogen-containing gas is continuously supplied.

(Supplementary Description 7)

There is provided the method of the supplementary description 1, wherein in forming the metal nitride film, the source gas and the nitrogen-containing gas are intermittently reacted with each other, to thereby intermittently form a metal nitride layer, and a thickness of the metal nitride layer formed per one reaction is set to 2 nm or less.

(Supplementary Description 8)

According to other aspect of the present invention, there is provided a substrate processing method including:

housing a substrate into a processing chamber; and forming a metal nitride film on the substrate by supplying a source gas containing a metal element, a nitrogen-containing gas and a hydrogen-containing gas into the processing chamber;

wherein in forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

(Supplementary Description 9)

According to further other aspect of the present invention, there is provided a substrate processing apparatus, including:

a processing chamber configured to house a substrate;

a source gas supply system configured to supply a source gas containing a metal element into the processing chamber;

a nitrogen-containing gas supply system configured to supply a nitrogen-containing gas into the processing chamber;

a hydrogen-containing gas supply system configured to supply a hydrogen-containing gas into the processing chamber; and a control part configured to control the source gas supply system, the nitrogen-containing gas supply system, and the hydrogen-containing gas supply system, so that a processing is performed to form a metal nitride film on the substrate by supplying the source gas, the nitrogen-containing gas, and the hydrogen-containing gas into the processing chamber in which the substrate is housed, and in the processing of forming the metal nitride film, the source gas and the nitrogen-containing gas are intermittently supplied into the processing chamber, or the source gas and the nitrogen-containing gas are intermittently and alternately supplied into the processing chamber, or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

(Supplementary Description 10)

According to further other aspect of the present invention, there is provided a program for making a computer execute:

a procedure of housing a substrate into a processing chamber of a substrate processing apparatus; and a procedure of forming a metal nitride film on the substrate by supplying a source gas containing a metal element, a nitrogen-containing gas, and a hydrogen-containing gas into the processing chamber;

wherein in forming the metal nitride film, the source gas and the nitrogen-containing gas are intermittently supplied into the processing chamber; or the source gas and the nitrogen-containing gas are intermittently and alternately supplied into the processing chamber; or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

(Supplementary Description 11)

According to further other aspect of the present invention, there is provided a computer readable recording medium in which a program is recorded for making a computer execute:

a procedure of housing a substrate into a processing chamber of a substrate processing apparatus; and a procedure of forming a metal nitride film on the substrate by supplying a source gas containing a metal element, a nitrogen-containing gas, and a hydrogen-containing gas into the processing chamber;

wherein in forming the metal nitride film, the source gas and the nitrogen-containing gas are intermittently supplied into the processing chamber; or the source gas and the nitrogen-containing gas are intermittently and alternately supplied into the processing chamber; or the source gas is intermittently supplied into the processing chamber in a state that supply of the nitrogen-containing gas into the processing chamber is continued, and the hydrogen-containing gas is supplied into the processing chamber during at least supply of the nitrogen-containing gas into the processing chamber.

(Supplementary Description 12)

According to further other aspect of the present invention, there is provided a method of manufacturing a semiconductor device, including:

housing a substrate into a processing chamber; and forming a metal nitride film on the substrate by supplying a source gas containing a metal element, a nitrogen-containing gas and a hydrogen-containing gas into the processing chamber;

wherein in forming the metal nitride film, the source gas is supplied into the processing chamber during supply of the nitrogen-containing gas into the processing chamber, and the hydrogen-containing gas is supplied into the processing chamber during supply of the nitrogen-containing gas into the processing chamber, or during stop of supply of the nitrogen-containing gas, and during stop of supply of the source gas.

(Supplementary Description 13)

There is provided the method of the supplementary description 12, wherein in forming the metal nitride film, the source gas is intermittently supplied during supply of the nitrogen-containing gas.

(Supplementary Description 14)

There is provided the method of the supplementary description 12 or 13, wherein in forming the metal nitride film, supplying the source gas and the nitrogen-containing gas, and supplying the hydrogen-containing gas are set as one cycle, and this cycle is performed once or more.

(Supplementary Description 15)

There is provided the method of the supplementary description 13 or 14, wherein in forming the metal nitride film, the source gas and the nitrogen-containing gas are intermittently reacted with each other, to thereby intermittently form a metal nitride layer, and a thickness of the metal nitride layer formed per one reaction is set to 2 nm or less.

(Supplementary Description 16)

There is provided the method of any one of the supplementary descriptions 12 to 15, wherein in forming the metal nitride film, the hydrogen-containing gas is continuously supplied.

(Supplementary Description 17)

There is provided the method of any one of the supplementary descriptions 1 to 7, 12 to 16, wherein the source gas contains a halogen element.

(Supplementary Description 18)

There is provided the method of any one of the supplementary descriptions 1 to 7, 12 to 16, wherein the source gas contains a chlorine element or a fluorine element.

(Supplementary Description 19)

There is provided the method of any one of the supplementary descriptions 1 to 7, 12 to 16, wherein the source gas is a halogen-based gas.

(Supplementary Description 20)

There is provided the method of any one of the supplementary descriptions 1 to 7, 12 to 16, wherein the source gas is a chlorine-based gas or a fluorine-based gas.

(Supplementary Description 21)

There is provided the method of any one of the supplementary descriptions 17 to 20, wherein the nitrogen-containing gas is an ammonia gas, and the hydrogen-containing gas is a hydrogen gas.

(Supplementary Description 22)

There is provided the method of any one of the supplementary descriptions 1 to 7, 12 to 21, wherein in forming the metal nitride film, each gas is supplied into the processing chamber under a non-plasma atmosphere.

DESCRIPTION OF SIGNS AND NUMERALS

200 Wafer (substrate)
201 Processing chamber
202 Processing vessel
280 Controller (control part)

The invention claimed is:

1. A method of manufacturing a semiconductor device, comprising:

housing a substrate into a processing chamber; and forming a metal nitride film on the substrate by supplying a source gas containing a metal element, a nitrogen-containing gas being a reducing gas and a hydrogen-containing gas being a reducing gas into the processing chamber;

wherein in forming the metal nitride film, the source gas and the nitrogen-containing gas are intermittently supplied into the processing chamber under a non-plasma atmosphere, or the source gas and the nitrogen-containing gas are intermittently and alternately supplied into the processing chamber under the non-plasma atmosphere, or the source gas is intermittently supplied into the processing chamber in a state that supply of the nitrogen-containing gas into the processing chamber under the non-plasma atmosphere is continued, the source gas and the nitrogen-containing gas are intermittently reacted with each other, to thereby intermittently form a metal nitride layer, and the hydrogen-containing gas is supplied into the processing chamber under the non-plasma atmosphere during at least supply of the nitrogen-containing gas into the processing chamber, to thereby modify the metal nitride layer.

2. The method of claim 1, wherein in forming the metal nitride film, the nitrogen-containing gas and the hydrogen-containing gas are simultaneously supplied.

3. The method of claim 2, wherein in forming the metal nitride film, the source gas is supplied during supply of the nitrogen-containing gas, and at this time, the nitrogen-containing gas and the hydrogen-containing gas are simultaneously supplied.

4. The method of claim 3, wherein in forming the metal nitride film, the source gas is intermittently supplied during supply of the nitrogen-containing gas, and at this time, the nitrogen-containing gas and the hydrogen-containing gas are simultaneously supplied.

5. The method of claim 2, wherein in forming the metal nitride film, the source gas and the nitrogen-containing gas are alternately supplied, and at this time, the nitrogen-containing gas and the hydrogen-containing gas are simultaneously supplied.

6. The method of claim 1, wherein in forming the metal nitride film, the hydrogen-containing gas is continuously supplied.

7. The method of claim 1, wherein in forming the metal nitride film, the source gas and the nitrogen-containing gas are intermittently reacted with each other, to thereby intermittently form a metal nitride layer, and a thickness of the metal nitride layer formed per one reaction is set to 2 nm or less.

8. The method of claim 1, wherein the nitrogen-containing gas is an ammonia gas.

9. A substrate processing method comprising:
housing a substrate into a processing chamber; and
forming a metal nitride film on the substrate by supplying a source gas containing a metal element, a nitrogen-containing gas being a reducing gas and a hydrogen-containing gas being a reducing gas into the processing chamber;
wherein in forming the metal nitride film,
the source gas and the nitrogen-containing gas are intermittently supplied into the processing chamber under a non-plasma atmosphere, or
the source gas and the nitrogen-containing gas are intermittently and alternately supplied into the processing chamber under the non-plasma atmosphere, or
the source gas is intermittently supplied into the processing chamber in a state that supply of the nitrogen-containing gas into the processing chamber under the non-plasma atmosphere, is continued,
the source gas and the nitrogen-containing gas are intermittently reacted with each other, to thereby intermittently form a metal nitride layer, and
the hydrogen-containing gas is supplied into the processing chamber under the non-plasma atmosphere during at least supply of the nitrogen-containing gas into the processing chamber, to thereby modify the metal nitride layer.

10. A substrate processing apparatus, comprising:
a processing chamber configured to house a substrate;
a source gas supply system configured to supply a source gas containing a metal element into the processing chamber;
a nitrogen-containing gas supply system configured to supply a nitrogen-containing gas being a reducing gas into the processing chamber;
a hydrogen-containing gas supply system configured to supply a hydrogen-containing gas being a reducing gas into the processing chamber; and
a control part configured to control the source gas supply system, the nitrogen-containing gas supply system, and the hydrogen-containing gas supply system, so that a processing is performed to form a metal nitride film on the substrate by supplying the source gas, the nitrogen-containing gas, and the hydrogen-containing gas into the processing chamber in which the substrate is housed, and in the processing of forming the metal nitride film, the source gas and the nitrogen-containing gas are intermittently supplied into the processing chamber under a non-plasma atmosphere, or the source gas and the nitrogen-containing gas are intermittently and alternately supplied into the processing chamber under the non-plasma atmosphere, or the source gas is intermittently supplied into the processing chamber in a state that supply of the nitrogen-containing gas into the processing chamber under the non-plasma atmosphere is continued, the source gas and the nitrogen-containing gas are intermittently reacted with each other, to thereby intermittently form a metal nitride layer, and the hydrogen-containing gas is supplied into the processing chamber under the non-plasma atmosphere during at least supply of the nitrogen-containing gas into the processing chamber, to thereby modify the metal nitride layer.

* * * * *